(12) United States Patent
Fukuzumi

(10) Patent No.: US 7,001,839 B2
(45) Date of Patent: Feb. 21, 2006

(54) SEMICONDUCTOR DEVICE WITH TAPERED CONTACT HOLE AND WIRE GROOVE

(75) Inventor: Yoshiaki Fukuzumi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 84 days.

(21) Appl. No.: 10/874,174

(22) Filed: Jun. 24, 2004

(65) Prior Publication Data

US 2004/0235290 A1 Nov. 25, 2004

Related U.S. Application Data

(63) Continuation of application No. 10/356,640, filed on Feb. 3, 2003, which is a continuation of application No. 09/405,127, filed on Sep. 24, 1999, now Pat. No. 6,541,864.

(30) Foreign Application Priority Data

Oct. 27, 1998 (JP) ............................................ 10-305388

(51) Int. Cl.
*H01L 21/4763* (2006.01)

(52) U.S. Cl. ....................................... 438/640; 438/648
(58) Field of Classification Search ................. 438/761, 438/725, 720, 700, 692, 689, 648, 640, 637, 438/396, 386
See application file for complete search history.

(56) References Cited

U.S. PATENT DOCUMENTS

| | | | |
|---|---|---|---|
| 4,933,303 A | 6/1990 | Mo | |
| 5,629,237 A | 5/1997 | Wang et al. | |
| 5,635,423 A | 6/1997 | Huang et al. | |
| 5,668,413 A | 9/1997 | Nanjo | |
| 5,686,357 A | 11/1997 | Howard | |
| 5,686,760 A | 11/1997 | Miyakawa | |
| 5,976,972 A | 11/1999 | Inohara et al. | |
| 6,025,259 A | 2/2000 | Yu et al. | |
| 6,060,385 A | 5/2000 | Givens | |
| 6,159,862 A | 12/2000 | Yamada et al. | |
| 6,187,671 B1 | 2/2001 | Irinoda | |
| 6,271,117 B1 | 8/2001 | Cherng | |

FOREIGN PATENT DOCUMENTS

| | | |
|---|---|---|
| JP | 06-037037 A | 2/1994 |
| JP | 07-283219 A | 10/1995 |
| JP | 07-321204 A | 12/1995 |
| JP | 08-017918 A | 1/1996 |
| JP | 08-107087 A | 4/1996 |
| JP | 08-288390 A | 11/1996 |
| JP | 10-177992 | 6/1998 |

*Primary Examiner*—Evan Pert
*Assistant Examiner*—Monica D. Harrison
(74) *Attorney, Agent, or Firm*—Banner & Witcoff, Ltd.

(57) ABSTRACT

In a semiconductor device having a wire structure, the thickness of a first insulation film substantially corresponds to the depth of a contact hole. A surface of a second insulation film serves as a bottom face of a wire groove. Regarding the contact hole, only a side wall portion intersecting a direction of the wire groove has a substantial taper angle. This configuration can be attained under conditions where an etching selectivity of the first insulation film to the second insulation film is set to be slightly lower and a portion of the second insulation film where an opening edge of an opening portion is exposed is slightly etched during etching process of the wire groove. With a semiconductor device having this structure, a conductive material embedding characteristic can be enhanced, while preventing possibility of short-circuit even when an interval between wires is reduced.

10 Claims, 20 Drawing Sheets

SEMICONDUCTOR DEVICE WITH TAPERED CONTACT HOLE AND WIRE GROOVE

CROSS-REFERENCE TO RELATED APPLICATIONS

This application is a continuation of prior U.S. patent application Ser. No. 10/356,640, filed Feb. 3, 2003, which is a continuation of prior U.S. patent application Ser. No. 09/405,127, filed Sep. 24, 1999 now U.S. Pat. No. 6,541,864, which claims priority under 35 U.S.C. §119 to Japanese patent application 10-305388, filed Oct. 27, 1998. The entire disclosures of the prior applications are hereby incorporated by reference herein.

BACKGROUND OF THE INVENTION

The present invention relates to a semiconductor device which has a particularly fine contact structure and which has been subjected to a high-density integration, and a method of manufacturing the same.

In a semiconductor device, an element area or an interwire contact structure obtained by contact holes are further made fine, and accuracy and low resistance contributing to high reliability are required.

FIGS. 12A to 12F are sectional views for explaining a first conventional example showing a method of manufacturing of a contact-wire structure in the order of manufacturing processes. This technique is illustrated, for example, with reference to Jpn. Pat Appln. Publication No. 9-172067 or the like, and it is a technique for forming wire grooves and contact holes in a self-aligning manner.

As shown in FIG. 12A, a wire layer 701 is formed in advance on a insulation film 700 by using a well-known technique such as a damascene method or the like, and an insulation film 702 such as a silicon oxide film is deposited on the insulation film 700. Next, as shown in FIG. 12B, an insulation film 703 different in etching rate from the insulation film 702, for example, a silicon nitride film or the like, is thin deposited on the insulation film 702.

Next, as shown in FIG. 12C, opening portions 704 are formed on the insulation film 703 by using a photolithography technique and an etching technique. Next, as shown in FIG. 12D, an insulation film 705 different in etching rate from the insulation film 703, for example the same silicon oxide film as the insulation film 702 or the like, is further deposited on the insulation film 703.

Next, as shown in FIG. 12E, wire grooves 706 are formed on the insulation film 705 by using a lithography technique and an anisotropic selective etching technique. At this time, portions of the insulation film 702 corresponding to overlapping portions of a wire groove pattern and the opening portions 704 are also etched. Thereby, contact holes 707 are also formed simultaneously with formation of the wire grooves 706. That is, it is possible to form the wire grooves 706 and the contact holes 707 in a self-aligning manner.

Next, as shown in FIG. 12F, conductive material 708 is embedded in the wire grooves 706 and the contact holes 707, and projecting portions of the conductive material 708 are removed by using, for example, CMP (Chemical Mechanical Polishing) so that the conductive material 708 is flattened. Thereby, contact plugs 710 and wire layers 709 are formed.

According to the above configuration, contact hole positions are determined at overlapping portions of the opening portions 704 and the wire grooves 706. When each wire groove 706 is formed wider in the vicinity of each contact hole position to securely accommodate each opening portion 704 at a time of formation of the wire grooves 706, a problem of misalignment between the wire groove 706 and the contact hole 707 can be overcome.

Also, when there is an extra area in a contact area of the lowermost layer to some extent, the opening portion 704 may be formed wider in the vicinity of the contact hole position at least in a direction intersecting the wire groove 706. The opening portion 704 can securely be accommodated in the wire groove 706 at a time of formation of the wire groove 706 so that the problem of misalignment between the wire groove 706 and the contact hole 707 can be overcome.

However, according to the first conventional example, the wire groove 706 and the contact hole 707 are formed by using an anisotropic selective etching technique. For this reason, side walls of the contact hole 707 are formed approximately vertically to a semiconductor substrate face.

FIGS. 13, 14A, 14B, 15, 16A and 16B are views showing problems regarding such a manufacturing method as the above first conventional example. FIG. 13 is a plan view showing wire grooves and a contact hole, FIGS. 14A and 14B are sectional views taken along line XIVA—XIVA and XIVB—XIVB, respectively, and FIG. 15 is a sectional view showing an aspect where conductive material is embedded in the contact hole in the sectional view of FIG. 14A. FIGS. 16A and 16B are respectively sectional views corresponding to FIGS. 14A and 14B, for showing a modified example. Same reference numerals are attached to portions similar to the first conventional example shown in FIGS. 12A to 12F.

In FIGS. 13, 14A and 14B, in an insulation film 703 defining a bottom portion of a wire groove, an opening portion 704 is formed wider in the vicinity of a contact hole position at least in a direction intersecting a wire groove 706. A contact hole 707 is etched approximately vertically to the bottom portion. It is difficult to embed barrier metal or conductive material 708 in such a contact hole 707 in a preferable manner.

As shown in FIG. 15, for example, there is a drawback in which a seam 711 and a void 712 may occur. The seam 711 prevents planarization in a grinding process performed later. It is hard to foresee adverse influence of gas in the void 712 in a heating process performed later.

In view of the above, it is considered to employ a taper etching technique as a method for embedding conductive material 708 in the contact hole 707 in a preferable manner. That is, a taper angle is provided to a side wall of the contact hole 707 by controlling etching conditions. Thereby, an embedding characteristic of the conductive material 708 embedded in the contact hole 707 is improved.

FIGS. 16A and 16B are sectional view corresponding to FIGS. 14A and 14B, where the taper etching technique is adopted. That is, FIGS. 16A and 16B show a structure obtained by employing the taper etching technique in order to form wire grooves 706 and contact holes 707 simultaneously.

As shown in FIG. 16A, in a section taken along a direction of the wire groove 706, a taper angle is provided to each contact hole side wall by a method using the taper etching technique so that improvement in embedding characteristic is expected. It should be noted that, when an area (an area contacting with conductive material) of a contact hole bottom face 715 is intended to be secured to some extent, an opening area at an upper portion of the contact hole 707 is larger than the area of the contact hole bottom face 715.

As shown in FIG. 16B, a section taken along a direction perpendicular to the wire groove 706 clearly illustrates a harmful influence due to using the taper etching technique. When the area (an area contacting with conductive material) of the contact hole bottom face 715 is intended to be secured to some extent, the opening area of the upper portion of the contact hole 707 becomes larger than the area of the bottom face.

As mentioned above, as the contact holes 707 and the wire grooves 706 are simultaneously formed, all the wire grooves 706 are tapered. Accordingly, an interval between adjacent wire grooves 706 at their upper portions is made small, so that the possibility that a short-circuit may occur between wire layers increases.

Namely, the wire groove 706 itself has an aspect ratio smaller than that of the contact hole portion, and the taper angle is not so required at the side wall of the wire groove. However, the side wall of the wire groove 706 is necessarily provided with a taper angle when the method for forming the wire grooves 706 and the contact holes 707 simultaneously is used. As shown with Db in FIG. 16B, a configuration where the adjacent wire grooves are unnecessarily close to each other prevents the wire region or area from being more finely structured.

On the other hand, attention is paid to the contact structure itself in the contact hole. As fine structurization advances, contact resistance, reaction barrier performance and covering characteristic for serving as an embedded plug become important. A conventional example will be explained below.

In a semiconductor device, metal, for example, W (tungsten), Al (aluminum) or the like, is often used as a wire layer or a contact plug. There is a drawback that such metal for a contact plug reacts with a wire layer (including a silicon substrate and a poly-plug) which is an underlayer, which may result in junction failure.

Accordingly, barrier metal is often used as the contact plug. TiN (Titanium nitride) is given as a representative barrier metal. Assuming a contact metal to a Si substrate, it is common to form TiSi2 (Titanium Silicide) between the barrier metal TiN and the Si substrate in order to obtain a good contact resistance.

FIGS. 17A to 17C are sectional views for respectively explaining a second conventional example showing a method for manufacturing a contact plug in a Si substrate in the order of manufacturing processes. This example includes a step of forming a barrier metal of TiN using a sputtering method.

First, a contact hole 802 is formed in an insulation film 801 on a substrate 800 by using a lithography technique and an etching technique. Thereafter, Ti and TiN are sequentially deposited on the insulation film 801 and in the contact hole 802 by using a sputtering method (see FIG. 17A). Next, the Si substrate thus processed is annealed in nitrogen atmosphere, so that the Ti at the lower portion is changed to TiSi2 (see FIG. 17B). Then, W is embedded in the contact hole and a top face of the Si substrate is flattened (see FIG. 17C).

In this method, the TiN can be deposited in any thickness in order to increase a barrier performance. As shown in FIGS. 17B and 17C, however, covering characteristic deteriorates at an edge of a contact bottom portion in a deposition shape of TiN obtained by the sputtering method. At a portion 803 where the covering characteristic deteriorates, a barrier performance is also lowered. As a result, there occurs a drawback that yield or reliability may be lowered.

FIGS. 18A to 18C are sectional views for respectively explaining a third example showing a method for manufacturing a contact plug in a Si substrate in the order of manufacturing processes. This example includes a process where Ti deposited by a sputtering process is thermally nitrided to be changed to a barrier metal of TiN. In this example, the same reference numerals denote the same portions as those in the second example.

First, a contact hole 802 is formed in an insulation film 801 on a substrate 800 by using a lithography technique and an etching technique. Thereafter, Ti is deposited on the insulation film 801 and in the contact hole 802 by using a sputtering process (see FIG. 18A). In this state, the substrate thus processed is annealed in nitrogen atmosphere. Thereby, a lower portion of the contact hole is changed to TiSi2 and an upper portion thereof except for the lower portion is thermally nitrided to be changed to TiN (see FIG. 18B). Then, W is embedded in the contact hole and a top portion thereof is flattened (see FIG. 18C).

In this method, a Ti film having more excellent covering characteristic than TiN is thermally nitrided. For this reason, TiN can be formed approximately uniformly even at an edge of a contact bottom portion. In the bottom portion of the contact hole 802, however, as the TiN film and the lower TiSi2 film are simultaneously formed, a ratio of the film thicknesses of the TiN film and the TiSi2 is determined according to the respective reaction rates of the TiN film and the TiSi2 film. That is, the distribution of the thicknesses of the TiN film and the TiSi2 film is necessarily determined according to a difference between two reaction rates of Ti→TiN and Ti→TiSi2, as shown by broken circle 804. Accordingly, the film thicknesses of the both could not have been optimized independently.

FIGS. 19A to 19C are sectional views for respectively explaining a fourth conventional example showing a method for manufacturing a contact plug to a Si substrate in the order of manufacturing processes. This example includes a deposition process of TiN according to CVD process. In this example, same reference numerals denote portions similar to those of the second conventional example.

First, a contact hole 802 is formed in an insulation film 801 on a substrate 800 by using lithography technique and etching technique. Next, Ti and TiN are deposited on the insulation film 801 by CVD process (see FIG. 19A). In this state, the substrate thus processed is annealed in nitrogen atmosphere. Thereby, Ti of the lower portion in the contact hole is changed to TiSi2 (see FIG. 19B). Thereafter, W is embedded in the contact hole, and the upper portion thereof is flattened (see FIG. 19C).

In this method, CVD-TiN having an excellent edge covering characteristic is used. Accordingly, an excellent barrier performance can be obtained even at an edge of the contact hole bottom portion. In the CVD process, however, Ti and TiN are deposited even on a side wall of the contact hole with the almost same thickness as that of the bottom portion. For this reason, there occurs a problem that fine structurization proceeds so that the diameter of the contact hole becomes small.

That is, when TiN is not made sufficiently thick as compared with the minimum thickness film required to serve as a reaction barrier, the contact hole is almost filled with barrier metal, as shown by broken circle 805 in FIG. 19C. Therefore, it becomes difficult to embed metal having a resistance lower than that of the barrier metal, for example, W, Al, Cu or the like, in the contact hole later. Consequently, there occurs a problem that the resistance of the contact plug can not be reduced sufficiently.

In this manner, even when attention is paid to the contact plug structure, as the fine structurization advances, it becomes impossible for the conventional techniques to meet the contact resistance, the barrier performance and the metal embedding characteristic.

Conventionally, formation of contact holes using the taper etching technique has an advantage where an embedding shape of conductive material embedded thereafter becomes good. On the contrary, there occurs a problem that the upper portion (opening) of the contact hole becomes uniformly larger than the bottom portion thereof.

That is, when a contact area of the contact hole bottom portion is intended to be secured to some extent, a distance or interval between adjacent conductive portions, for example, adjacent wire grooves, becomes narrow. Therefore, there is a drawback in which, when conductive material is embedded in the above contact holes and wire grooves, adjacent wire layers which should originally be isolated may be short-circuited. A relationship between the wire grooves and the contact holes arranged at fine intervals causes a much serious problem.

Also, when attention is paid to the contact plug structure of the contact hole, it becomes difficult in the conventional techniques to form a structure where all the contact resistance, the reaction barrier performance and the metal embedding characteristic are made excellent, which result in necessity of further improvement.

BRIEF SUMMARY OF THE INVENTION

In view of the above circumstances, a first object of the present invention is to provide a semiconductor device where contact holes are formed to wire grooves in a self-aligning manner and which has a structure having an excellent conductive material embedding characteristic while preventing wires from being short-circuited even when an interval between the wires is reduced, and a method of manufacturing the same.

A second object of the invention is to provide a method of manufacturing a semiconductor device which has a highly reliable contact plug structure where contact resistance, barrier performance and metal embedding characteristic are satisfied sufficiently even when the semiconductor device is made highly fine.

A semiconductor device according to a first aspect of the present invention comprising a first insulation film; a second insulation film formed on the first insulation film and having an opening portion; a third insulation film formed on the opening portion and the second insulation film; and a contact hole formed in the third insulation film and the first insulation film, wherein only the side wall portion conducted by the opening portion of a side wall of the contact hole is provided with a substantial taper angle.

The semiconductor device according to the first aspect of the present invention may further comprise a wiring groove formed in the third insulation film and on the second insulation film, wherein only a portion of a side wall of the contact hole, which is in the direction crossing the direction of the wiring groove, is provided with a substantial taper angle.

In the semiconductor device according to the first aspect of the present invention, the etching rates of the first and third insulation films may be larger than that of the second insulation film under an appropriate etching condition.

A semiconductor device according to a second aspect of the present invention comprises a first insulation film; a second insulation film formed on the first insulation film and having an opening portion; a third insulation film formed on the opening portion and the second insulation film; and a contact hole formed in the third insulation film and the first insulation film, wherein a first taper angle formed on at least a portion of a side wall portion of the contact hole formed in the first insulation film is larger than a second taper angle of a side wall portion of the contact hole formed in the third insulation film.

A semiconductor device according to a third aspect of the present invention comprises a first insulation film; a second insulation film formed on the first insulation film and having an opening portion; a third insulation film formed on the opening portion and the second insulation film; a contact hole formed in the third insulation film and the first insulation film; and a wiring groove formed in the third insulation film and on the second insulation film, wherein a taper angle formed on a side wall portion of the contact hole is larger than a taper angle of a side wall of the wiring groove.

A semiconductor device according to a fourth aspect of the present invention comprises a transistor provided with a gate electrode formed on a semiconductor substrate and a source/drain region formed in the semiconductor substrate, close to the gate electrodes; a first insulation film deposited to cover the transistor; a second insulation film formed on the first insulation film and having an opening portion; a third insulation film formed on the opening portion and the second insulation film; and a contact hole formed in the third insulation film and the first insulation film and which is connected to the gate electrode or the source/drain region, wherein only a side wall portion of the contact hole is provided with a substantial taper angle.

A semiconductor device according to a fifth aspect of the present invention comprises a first insulation film formed on a semiconductor substrate; a second insulation film formed on the first insulation film, having an opening hole leading to a contact hole; and a third insulation film formed on the second insulation film, separating a wire groove, wherein the contact hole is formed in a region corresponding to a region where a bottom portion of the wire groove and the opening portion are in contact with each other, and a taper angle formed on at least one portion of a side wall of the contact hole is larger than a taper angle of a side wall of the wire groove.

A semiconductor device according to a sixth aspect of the present invention comprises a first insulation film formed on a semiconductor substrate; a second insulation film formed on the first insulation film, having a plurality of opening holes leading to contact holes; and a third insulation film formed on the second insulation film, separating a plurality of wire grooves, wherein each of the contact holes is formed in a region corresponding to a region where a bottom portion of a corresponding one of the wire grooves and a corresponding one of the opening holes are in contact with each other, and a substantial taper angle is provided on only a side wall of each of the contact holes along an edge of a corresponding one of the opening holes at a bottom portion of a corresponding one of the wire grooves.

A method of manufacturing a semiconductor device according to a seventh aspect of the present invention comprises the steps of depositing a first insulation film on a semiconductor substrate; depositing a second insulation film on the first insulation film; forming in the second insulation film an opening portion; depositing a third interlayer insulation film on the second interlayer insulation film and on portions of the first insulation film exposed by the opening portion; and etching the third insulation film and the first insulation film to form a wire groove on the third insulation film while the second insulation film is hardly etched, and to form a contact hole in the first insulation film with a substantial taper angle at a portion of a side wall of the contact hole while an edge portion of the opening portion exposed during the etching process is gradually removed, using an anisotropic selective etching technique having a slightly lower etching selectivity.

A method of manufacturing a semiconductor device according to an eighth aspect of the present invention, comprises the steps of forming a transistor provided with a gate electrode on a semiconductor substrate, and a source/region region in the semiconductor substrate, adjacent to the gate electrode; depositing a first insulation film over the transistor; depositing a second insulation film on the first insulation film; forming an opening portion in the second insulation film; depositing a third interlayer insulation film on the second interlayer insulation film and a portion of the first insulation film exposed by the opening hole; and etching the third insulation film and the first insulation film to form a wire groove on the third insulation film while the second insulation film is hardly etched, and to form in the first insulation film a contact hole leading to the gate electrode or the source/drain region of the transistor with a substantial taper angle at a portion of a side wall of the contact hole while an edge portion of the opening portion exposed during the etching process is gradually removed, using an anisotropic selective etching technique having a slightly lower etching selectivity.

A method of manufacturing a semiconductor device according to a ninth aspect of the present invention comprises the steps of forming an opening hole in an insulation film; depositing a first refractory metal film in the opening hole; nitrifying a surface of the first refractory metal film; depositing a second refractory metal film on a nitrified surface of the first refractory metal film; and changing the second refractory metal film to a nitride film by a thermal treatment.

A method of manufacturing a semiconductor device according to a tenth aspect of the present invention comprises the steps of forming an opening hole in an insulating film; depositing a first refractory metal film in the opening hole; depositing a refractory metal nitride film on a surface of the first refractory metal film; depositing a second refractory metal film on a surface of the refractory metal nitride film; and changing the second refractory metal film to a nitride film by heat treatment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
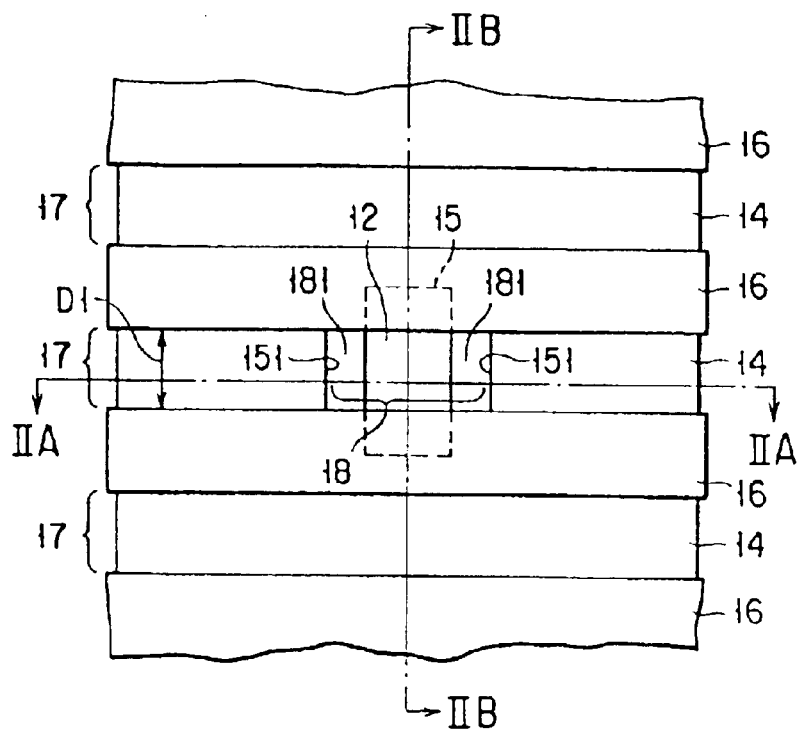
FIG. 1 is a top plan view showing a wiring groove and a contact hole according to a first embodiment of a semiconductor device of the present invention.
Figure 2A:
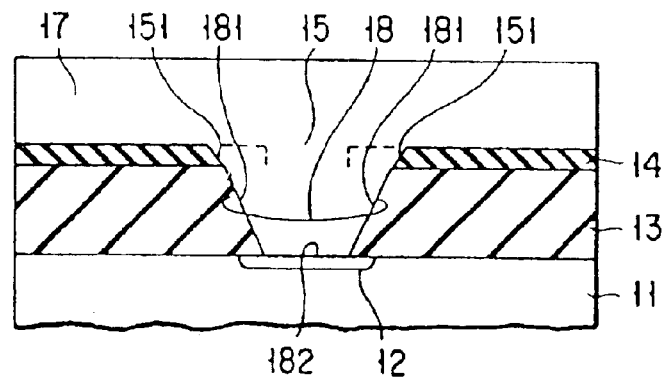
FIGS. 2A and 2B are sectional views along the line IIA—IIA and IIB—IIB respectively in FIG. 1.
Figure 2B:
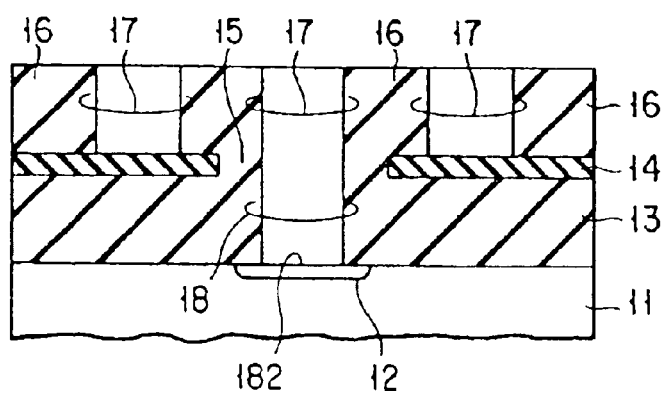

FIG. 1 is a top plan view showing a wiring groove and a contact hole according to a first embodiment of a semiconductor device of the present invention. FIG. 2A and FIG. 2B are sectional views along the lines IIA—IIA and IIB—IIB respectively in FIG. 1.

In FIGS. 1, 2A and 2B, a first insulation film 13 is formed on a semiconductor substrate 11 including a conductive region 12. The conductive region 12 is a diffused layer, a metal wiring layer or the like. A thin second insulation film 14 which differs in etching rate from the insulation film 13 is deposited on the first insulation film 13. This insulation film 14 is formed with an opening portion 15.

A third insulation film 16 which differs in etching rate from the insulation film 14 is formed on the first insulation film 13 and second insulation film 14 which are exposed by the opening portion 15. The third insulation film 16 may be formed of the same material as used for the first insulation film 13, specifically, these films may have the same etching rate.

A prescribed area of the third insulation film 16 is removed and in this area, a wiring groove 17 is formed. The surface of the second insulation film 14 is exposed from the bottom of the wiring groove 17. A contact hole 18 for exposing a prescribed area of the underlying conductive region 12 is formed in the area where the etched area of the wiring groove 17 is overlapped on the opening portion 15 formed in the insulation film 14. The thickness of the first insulation film 13 corresponds substantially to the depth of the contact hole 18. The surface of the second insulation film 14 is the bottom of the wiring groove 17.

In the present invention, as to the contact hole 18, only a side wall part 181 crossing the direction of the wiring groove 17 is provided with a substantial taper angle. Specifically, a taper angle which contributes to an improvement in the characteristics of embedding a plug conductive material is provided. Incidentally, the side wall of the wiring groove 17 scarcely has a taper angle. That is, even when the side wall of the wiring groove 17 is tapered, the taper angle of the side wall of the wiring groove 17 is much smaller than the taper angle provided on the side wall portion 181 of the contact hole 18.

In the above structure, the upper portion (frontage) of the contact hole 18 is a rectangle having a longer side in the direction of the wiring groove and is larger in area than the bottom of the contact hole. This structure improves the characteristics of embedding a conductive material for a contact plug to be formed later and increases the amount of the conductive material to be embedded. This structure is therefore advantageous in reducing the resistance of the contact plug and the contact resistance at the bottom of the contact plug. The contact plug is expected to be reduced in the resistance and to be improved in the reliability in this invention.

Also, the side wall of the wiring groove 17 scarcely has a taper angle, and hence the present invention does not provide a structure inhibiting the integration of a wiring region unlike the described prior art structure. Therefore, a fine wiring interval D1 can be kept (see FIG. 1) while a sufficient area (a contact area with the conductive material) in a bottom 182 of the contact hole 18 is secured. As a consequence, the possibility of development of short circuits between wirings is reduced and a reduction in yield can be restrained. Also, the wiring region is expected to be more integrated.

A production method providing only the contact hole 18 with a taper will be explained. At least the first insulation film 13 is exposed to a circumstance in a given etching condition and etched. The etching selection ratio i.e. etching selectivity of the first insulation film 13 to the second insulation film 14 is designed to be slightly lower.

Here, on the premise that the third insulation film 16 and the first insulation film 13 have the same etching rate, the wiring groove 17 and at the same time the contact hole 18 are etched through the opening portion 15 which overlaps on the wiring groove 17. As a consequence, the configuration of the contact hole 18 as indicated by FIGS. 1, 2A and 2B is realized. This will be explained in more detail.

As shown in FIG. 2A, when the first insulation film 13 is etched through the opening portion 15 which overlaps on the wiring 17, the etching selectivity of the second insulation film 14 is kept. Although the second insulation film 14 is in the condition that it is scarcely etched, a hole edge portion 151 of the second insulation film 14 which is exposed from the bottom of the wiring groove 17 is liable to be etched compared with other bottoms (namely, the surface of the second insulation film 14) of the wiring groove 17 which are provided with no opening portion 15.

That is, the etching selectivity of the first insulation film 13 to the second insulation film 14 is designed to be slightly lower so that a part of the hole edge of the opening portion in the second insulation film 14 is conditioned to be slightly etched.

As a consequence, as shown in FIG. 2A, the hole edge of the opening portion 15 which has the form indicated by the dotted line at the start is gradually recessed during etching of the first insulation film 13 through the opening portion 15. The side wall portion 181 of the contact hole 18 can be tapered within the extent that it is not protruded from a region defined by the wiring groove 17.

It is clear from a comparison between the sections of each contact hole 18 of FIGS. 2A and 2B that the contact hole 18 is formed in which only the side wall portion 181 crossing the direction of the wiring groove 17 in which the hole edge of the opening portion 15 is exposed is substantially provided with a taper angle.

Therefore, the section in the direction which does not allow the hole edge of the opening portion 15 to be exposed is etched in a direction perpendicular to the substrate like the etching configuration of the wiring groove 17 (see FIG. 2B). It is understood that the present invention has the structure in which the angle of the taper formed on at least a part (the side wall 181) of the side wall of the contact hole 18 is larger than that of the side wall of the wiring groove 17.

In the method of this embodiment, a provision of a taper angle is made by lowering the etching selectivity unlike the case where a so-called taper etching technique in the prior art is applied.

This makes it possible to provide only the side wall portion 181 of the contact hole 18 with a substantial taper angle within the extent that the provision of the taper angle is not inconsistent with the self alignment of the wiring groove 17 with the contact hole 18 without providing the side wall of the wiring groove 17 with a substantial taper angle.

The bottom 182 of the contact hole 18, specifically, the contact area with the conductive region 12 can be optionally adjusted by a combination of the size of the opening portion 15, which is formed in advance, in the direction along the wiring groove 15 and the etching selectivity.

As shown in FIG. 1, when, for instance, an opening portion 15 with a rectangular shape having a longer side in the direction crossing the wiring groove 17 is formed in advance in the second insulation film 14, an opening portion 15 having a shape close to a cross is resultantly produced in the second insulation film 14.

If the method of this embodiment is applied, the provision of a substantial taper angle in the contact hole 18 is limited to the side wall 181 along the part where the hole edge of the opening portion 15 is exposed when the wiring groove 17 is formed. The frontage of the contact hole 18 becomes rectangular having a longer side in the direction of the wiring groove and the area of the bottom of the contact hole can be made as wide as possible.

Generally, as micronization advances many contact plugs come to have a circular shape as viewed from the above. However, the contact hole 18 provided with a substantial taper angle by using the method of this embodiment has a square (rectangular) form with a wide frontage as viewed from the above, improving the characteristics of embedding a conductive material which will be embedded in the contact hole later.

This is resultantly advantageous in reducing the resistance of a contact plug which will be produced later and the contact resistance at the bottom of the contact plug. Thus, in the present invention, the contact plug is expected to be reduced in resistance and to be improved in reliability.

Figure 3:
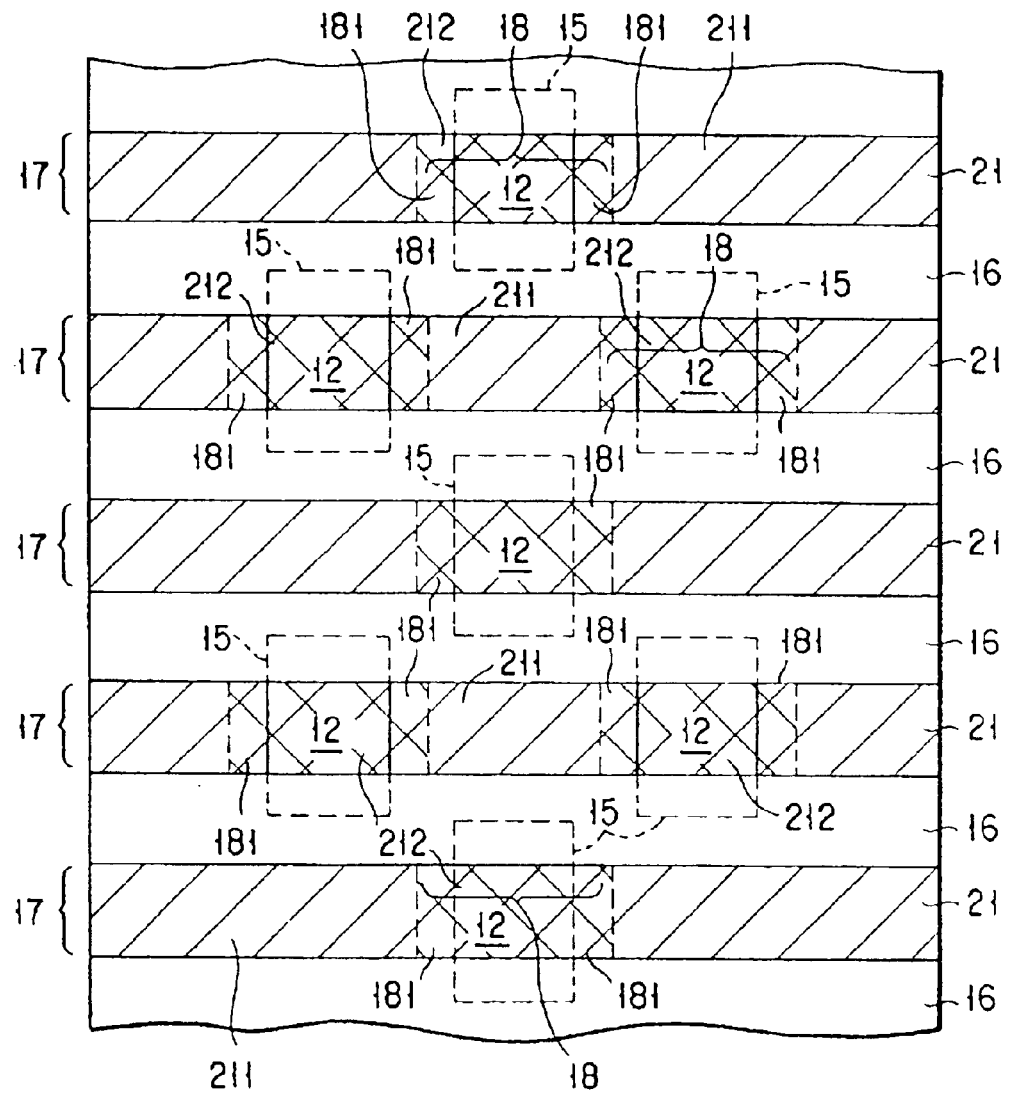
FIG. 3 is a top plan view showing a contact structure self-aligned with a conductive layer embedded in a wiring groove according to a second embodiment of a semiconductor device of the present invention.

FIG. 3 is a top plan view showing a contact structure self-aligned with conductive layer embedded in a wiring groove according to a second embodiment of a semiconductor device of the present invention. The same parts as in FIG. 1 are represented by the same symbols and explanations of these parts will be omitted.

An upper layer wiring 211 defined by plural wiring grooves 17 and plural contact plugs 212 connected to the wiring 211 and to an underlying conductive region are formed. These contact plugs 212 are formed along the plural wirings 211, with contact plugs formed along neighboring wirings alternating with each other. Each of the opening portions 15 formed in advance in the second insulation film 14 corresponding to each position of the contact plugs 212 has a rectangular form having a longer side in the direction crossing the wiring groove 17. Each of the opening portions 15 has a shape close to a cross after the contact hole 18 is formed.

Since the side wall of the wiring groove 17 scarcely has a taper angle in the above structure, the contact area of the contact plug 212 with the conductive region 12 is sufficiently secured and at the same time a fine wiring interval can be kept. As a consequence, the possibility of developments of short circuits between wirings is reduced and hence a reduction in yield can be restrained. Also, further integration of a wiring region can be expected.

Even in the above structure, the same production method as in the first embodiment may be used. Specifically, when the wiring groove 17 and the contact hole 18 are formed at the same time, the etching selectivity of the first insulation film 13 to the second insulation film 14 is designed to be slightly smaller, so that only the edge of the opening portion 15 in the second insulation film 14 is slightly etched. In other words, the etching is made in the condition that the surface of the second insulation film 14 is scarcely etched and the hole edge of the opening portion 15 formed in the second insulation film 14 is slightly etched.

The hole edge of the opening portion 15 which is exposed by the wiring groove 17 is gradually recessed by forming each wiring groove 17 and the contact hole 18 at the same time in the above etching condition. This enables it possible to provide the side wall portion 181 of the contact hole 18 with a substantial taper angle within the extent that the side wall portion 181 is not protruded from a region defined by the wiring groove 17.

In the wiring groove 17 and contact hole 18 formed in this manner, specifically, in the wiring groove 17 having a side wall which is almost perpendicular to the bottom and in the contact hole 18 in which only the side wall portion 181 crossing the direction of the wiring groove 17 has a substantial taper angle, the conductive material 21 is embedded and planarized (wiring 211).

The contact hole 18 in which only the side wall portion 181 is provided with a substantial taper angle in such a method as in the above embodiment improves the characteristics of embedding the conductive material 21 which will be embedded in the contact hole. Accordingly, as to the contact plug 212, a reduction in the resistance and an improvement in the reliability can be expected.

Also, a provision of a taper angle on the side wall portion 181 of the contact hole 18 is made by designing the etching selectivity to be slightly lower, namely by lowering the etching selectivity. This enables it possible to provide only a part (side wall portion 181) of the side wall of the contact hole with a taper angle within the extent that the provision of the taper angle is not inconsistent with the self alignment of the wiring groove 17 with the contact hole 18 without providing the side wall of the wiring groove 17 with a taper angle.

The contact area of the bottom of the contact plug 212 with the conductive region 12 can be optionally adjusted by a combination of the size of the opening portion 15, which is formed in advance, in the direction along the wiring groove 17 and the etching selectivity of the first insulation film 13 to the second insulation film 14.

As stated above, each contact hole 18 is formed so as to be self-aligned with the wiring groove 17 and is not protruded from a region defined by wiring groove 17. Accordingly, even in the case where plural contact holes 18 are formed densely as shown in FIG. 3, each opening portion 15 formed in advance in the insulation film 14 can be formed so as to be wider (rectangular) in the direction crossing the wiring groove 17 (within the maximum tolerable wiring interval).

Such a wider opening portion 15 can ease difficulties in a lithography step of transferring the pattern of the contact hole. Also, such a wider opening portion 15 makes it possible to secure an alignment margin for the formation of the wiring groove 17 within the maximum tolerable area of the underlying conductive region 12.

Figure 4:
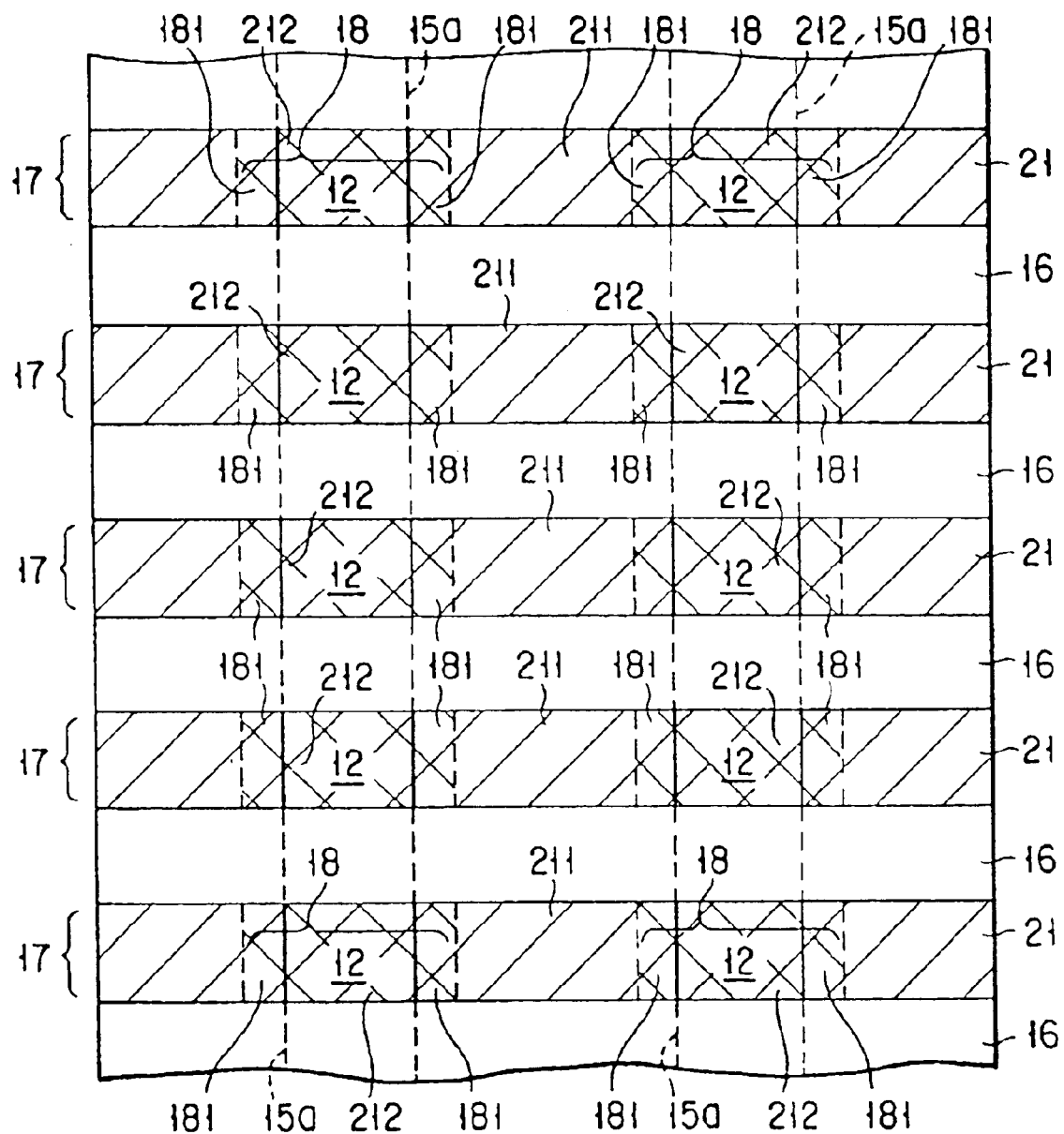
FIG. 4 is a top plan view showing a contact structure self-aligned with a conductive layer embedded in a wiring groove according to a third embodiment of a semiconductor device of the present invention.

FIG. 4 is a top plan view showing a contact structure self-aligned with a conductive layer embedded in a wiring groove according to a third embodiment of a semiconductor device of the present invention. The same parts as in FIG. 1 are represented by the same symbols and explanations of these parts will be omitted.

An upper layer wiring 211 defined by plural wiring grooves 17 and plural contact plugs 212 to which the wiring 211 and an underlying conductive region are connected are formed. These contact plugs 212 are formed along the plural wirings 211, with each corresponding contact plug being arranged in the same position on each wiring 211. Each of the opening portions 15a formed in advance in the second insulation film 14 corresponding to the position of the contact plug 212 has a slit form crossing plural wiring grooves 17. After each contact hole 18 is formed, each slit opening portion 15a exhibits a configuration with an etched recess portion crossing the slit along the wiring groove 17.

Since the side wall of the wiring groove 17 scarcely has a taper angle in the above structure, the contact area of the contact plug 212 with the conductive region 12 is sufficiently secured and at the same time a fine wiring interval can be kept. As a consequence, the possibility of developments of short circuits between wirings is reduced and hence a reduction in yield can be restrained. Also, further integration of a wiring region can be expected.

When each corresponding contact hole 18 is formed in the same corresponding position of each wiring groove 17, the possibility that the interval between neighboring wiring grooves can be made narrower than that in the structure of FIG. 3 is high. This is because, unlike the case of FIG. 3 in which the opening portions 15 are arranged along the plural wirings, alternating each other, neighboring wiring grooves 17 are not independent from each other with respect to the opening portions 15a.

Even in the above structure, the same production method as in the first embodiment may be used. Specifically, when the wiring groove 17 and the contact hole 18 are formed at the same time, the etching selectivity of the first insulation film 13 to the second insulation film 14 is designed to be slightly lower. In other words, the etching is made in the condition that the surface of the second insulation film 14 is scarcely etched and the hole edge of the opening portion 15a formed in the second insulation film 14 is slightly etched.

The hole edge of the opening portion 15a which is exposed by the wiring groove 17 is gradually recessed by forming each wiring groove 17 and the contact hole 18 at the same time in the above etching condition. This enables it possible to provide the side wall portion 181 of the contact hole 18 with a substantial taper angle within the extent that the side wall portion 181 is not protruded from a region defined by the wiring groove 17.

In the wiring groove 17 and contact hole 18 formed in this manner, specifically, in the wiring groove 17 having a side wall which is almost perpendicular to the bottom and in the contact hole 18 in which only the side wall portion 181 crossing the direction of the wiring groove 17 has a substantial taper angle, the conductive material 21 is embedded and planarized (wiring 211).

The contact hole 18 in which only the side wall portion 181 is provided with a substantial taper angle in such a method as in the above embodiment improves the characteristics of embedding the conductive material 21. Accordingly, as to the contact plug 212, a reduction in the resistance and an improvement in the reliability can be expected.

Also, a provision of a taper angle on the side wall portion 181 of the contact hole 18 is made by designing the etching selectivity to be slightly lower, namely by lowering the etching selectivity. This enables it possible to provide only a part (side wall portion 181) of the side wall of the contact hole with a taper angle within the extent that the provision of the taper angle is not inconsistent with the self alignment of the wiring groove 17 with the contact hole 18 without providing the side wall of the wiring groove 17 with a taper angle.

The contact area of the bottom of the contact plug 212 with the conductive region 12 can be optionally adjusted by a combination of the size of the opening portion 15a, which is formed in advance, in the direction along the wiring groove 17 and the etching selectivity of the first insulation film 13 to the second insulation film 14.

As stated above, each contact hole 18 is formed so as to be self-aligned with the wiring groove 17 and is not protruded from a region defined by wiring groove 17. Accordingly, even in the case where each corresponding contact hole 18 is formed in the same position of each wiring groove 17 as shown in FIG. 4, each opening portion 15a formed in advance in the insulation film 14 can be formed into a slit crossing each wiring groove 17.

Such a slit opening portion 15a can ease difficulties in a lithography step of transferring the pattern of the contact hole. Also, such a slit opening portion 15a makes it possible to secure a certain level of an alignment margin for the formation of the wiring groove 17 within the maximum tolerable area of the underlying conductive region 12.

Moreover, in the case where each corresponding contact hole 18 is formed in the same position of each wiring groove 17 as shown in FIG. 4, the opening portion 15a having such a slit shape renders it possible to make the interval between the neighboring wirings 17 narrower than that in the structure of FIG. 3.

To state in more detail, in the case of each independent opening portion 15 shown in FIG. 3, it is necessary to consider the relation of the interval between the neighboring wiring grooves 17 and the size of the opening portion 15 so that one wiring groove 17 does not extend to the region of the opening portion 15 of the neighboring wiring groove 17. On the contrary, in the case of the slit opening portion 15a shown in FIG. 4, the aforementioned consideration is not required to determine the interval between the neighboring wiring grooves 17. In the third embodiment, a semiconductor device having a structure in which the interval between the neighboring wiring grooves 17 is more fine can be provided.

FIGS. 5A to 5F are sectional views showing the steps of producing a peripheral circuit region of a semiconductor device according to a fourth embodiment of the present invention in order.

Figure 5A:
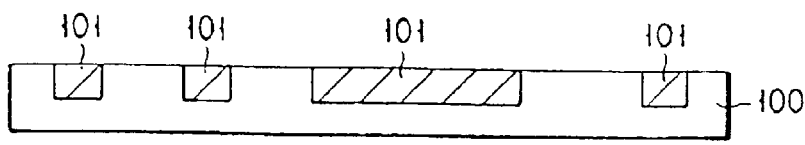
FIGS. 5A to 5F are sectional views showing the steps of manufacturing a peripheral circuit region of a semiconductor device in order according to a fourth embodiment of the present invention.
Figure 5B:
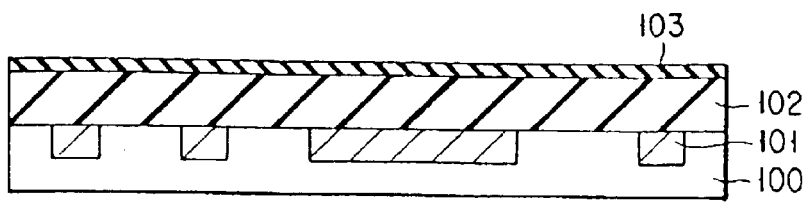

As shown in FIG. 5A, a conductive layer 101 is formed on an insulation layer 100 formed on a semiconductor substrate. Then, as shown in FIG. 5B, an insulation film 102, e.g., a silicon oxide film, is formed on the substrate including the conductive layers. A thin insulation film 103, e.g., a silicon nitride film, differing in etching rate from the insulation film 102 is further deposited. A silicon nitride film is formed as the insulation film 103 in this embodiment, however, there can be used other insulating materials in place of silicon nitride, which has an etching selectivity to the insulation film 102, in which only the insulation film 102 is etched while the insulation film 103 is scarcely etched. Those materials include, for example, titanium oxide film (TiO2), alumina (Al2O3), tantalum oxide film (Ta2O5), BST film ((Ba, Sr)Tio3).

Figure 5C:
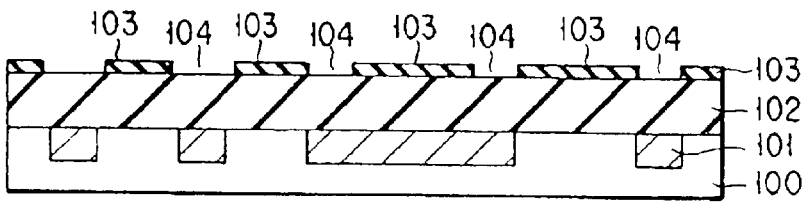

Then, as shown in FIG. 5C, an opening portion 104 is formed in the insulation film 103 using a well-known lithography technique and an etching technique. This opening portion 104 is a region including a portion where a contact hole will be formed.

Figure 5D:
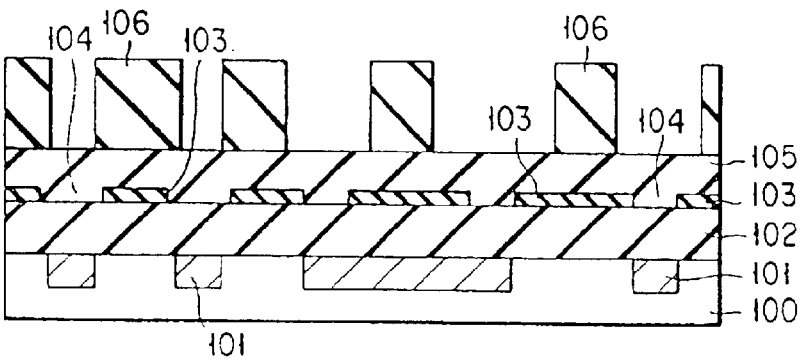

Next, as shown in FIG. 5D, an insulation film 105 differing in etching rate from the insulation film 103 is deposited. This insulation film 105 may be, for instance, the same silicon oxide film as used for the insulation film 102. Then, a resist film 106 is applied and then the resist film 106 of the part in which a wiring groove is to be formed is removed using a lithography technique.

Figure 5E:
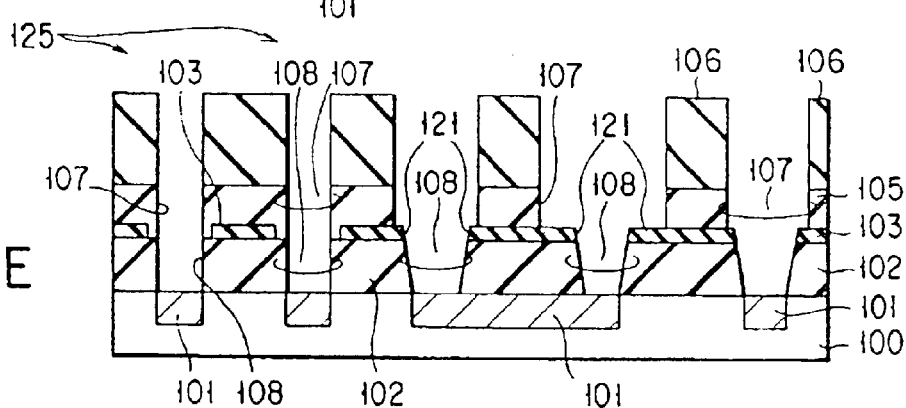

In succession, as shown in FIG. 5E, the insulation films 105 and 102 in the section from which the resist film 106 is removed are removed using a selective etching technique in the condition that the insulation film 103 is scarcely etched. By this operation, a wiring groove 107 is formed in the portion on which the insulation film 105 is deposited.

At this time, the bottom of the wiring groove 107 is defined by exposure of the insulation film 103. Also, at the same time, as viewed from the above, an insulation film 102 of the part in which the wiring groove 107 is overlapped on the opening portion 104 is etched to form a contact hole 108.

In the above etching, an etching condition with slightly lower selectivity of the insulation film 102 to the insulation film 103 is adopted in the present invention. As aforementioned, the region from which only the surface of the insulation film 103 is exposed is scarcely etched but the hole edge portion 121 of the insulation film 103 exposed from the bottom of the wiring groove is etched more easily than the bottom (the surface of the insulation film 103) of the wiring groove 107 formed with no opening portion 104.

As stated above, this embodiment adopts the condition that the etching selectivity of the insulation film 102 to the insulation film 103 is designed to be slightly lower so that the surface of the insulation film 103 is scarcely etched and the hole edge 121 of the opening portion 104 of the insulation film 103 is slightly etched.

Each wiring groove 107 and each contact hole 108 are formed at the same time in the above etching condition. In the etching, the side wall of the wiring groove 107 is formed almost vertically, the bottom is defined by the insulation film 103 and the hole edge of 121 of the opening portion 104 exposed by the wiring groove 107 is gradually recessed to form the contact hole 108 in the insulation film 102.

In the contact hole 108 having the configuration in which the hole edge 121 of the opening portion 104 is exposed from the bottom of the wiring groove 107, the side wall along the hole edge 121 of the opening portion 104 can be provided with a substantial taper angle within the extent that the side wall portion is not protruded from a region defined by the wiring groove 107.

In addition, the section of a contact hole of the insulation film 103 in which a hole edge is not exposed is indicated (125). The section of the contact hole in which the hole edge of the insulation film 103 is not exposed resultantly has a shape which has been etched almost perpendicularly with respect to the insulation layer 100.

As to the section (not shown) perpendicular to the section of the contact hole as shown in FIG. 5E, also in the contact hole 108 indicated by the numeral 125, the hole edge of the opening portion 104 is exposed from the bottom of the wiring groove 107 and the side wall of the contact hole along the hole edge portion can be provided with a substantial taper angle within the extent that the side wall portion is not protruded from a region defined by the wiring groove 107.

Figure 5F:
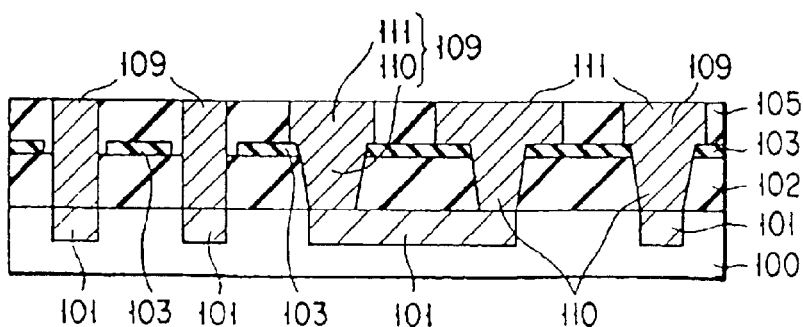

Next, as shown in FIG. 5F, the resist 106 is removed and an electroconductive material 109 is deposited in an embedding manner. Then, the conductive material 109 above the insulation film 105 is removed using, for instance, a CMP (Chemical Mechanical Polishing) method to planarize, thereby forming a contact plug 110 and a conductive layer 111.

In the above structure, the position of the contact hole is almost defined by the part where the opening portion 104 is overlapped on the wiring groove 107. If the wiring groove 107 is formed wider in the vicinity of the position of the contact hole so that the hole edge 121 of the opening portion 104 is surely put into the wiring groove 107 when the wiring groove 107 is formed, this can deal with an alignment error between the wiring groove 107 and the contact hole 108 and improves the characteristics of embedding the conductive material 109.

According to this embodiment, the contact plug 110, which connects the conductive layer 101 and the conductive layer 111, is provided with a taper angle. Here, it must be noted that this embodiment has the structure in which the side wall of the wiring groove 107 scarcely has a taper angle but only the contact hole 108 is provided with a taper angle.

Also, the provision of a substantial taper angle is limited to the side wall of the contact hole along the part where the hole edge portion 121 of the insulation film 104 is exposed when the wiring groove 107 is formed.

The contact area of the bottom of the contact plug 110 with the conductive region 101 can be optionally adjusted by a combination of the size of the opening portion 104, which is formed in advance, in the direction along the wiring groove 107 and the etching selectivity of the first insulation film 102 to the second insulation film 103.

The embodiment of this invention has the structure in which the area of the bottom of the contact plug 110 (contact area with the conductive region 101) is secured and at the same time the characteristics of embedding the conductive material 109 is improved. Also, since the side wall of the wiring groove 107 scarcely has a taper angle, a fine wiring interval can be kept. As a consequence, the possibility of developments of short circuits between wirings is reduced and hence a reduction in yield can be restrained. Also, further integration of a wiring region can be expected.

In prior art technologies, it is difficult to planarize the bottom of a wiring groove 107 when the wiring groove 107 is etched and hence to form the wiring such that the depths of all wirings are the same.

On the other hand, in this embodiment of the present invention, the wiring groove 107 is formed using a selective etching technique and the bottom of the wiring groove is defined by the insulation film 103. It is therefore easy to finish the bottom of the wiring groove 107 having various line widths flatly to a desired depth with the result that a variation in the sheet resistance of the conductive layer 111 can be restrained to a small level.

FIGS. 6A to 6G are sectional views showing the steps of forming a semiconductor device according to a fifth embodiment of the present invention in order, for instance, showing a part of the production process of a DRAM. In the figure, MC represents a memory cell region and PC represents a peripheral circuit region.

Figure 6A:
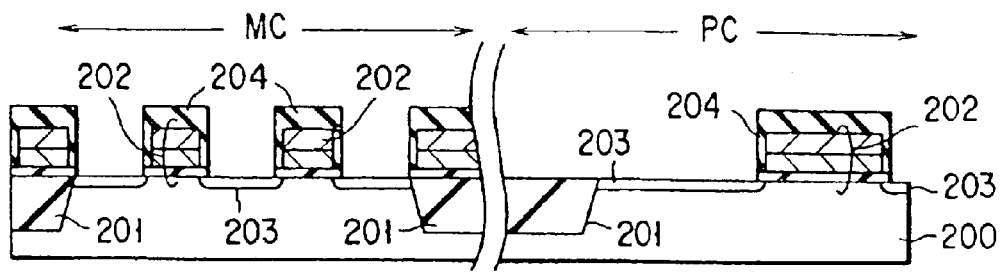
FIGS. 6A to 6G are sectional views showing the steps of manufacturing a semiconductor device in order according to a fifth embodiment of the present invention.

As shown in FIG. 6A, using a usual technology, an element isolated region 201 is formed on a semiconductor substrate 200, and an insulation gate type gate electrode 202 and source and drain diffusion layers 203 are formed on prescribed regions. The element isolated region 201 is formed by elemental isolation according to a selective oxidation method (LOCOS) or by a trench elemental isolation method (STI).

A structure which is considered to be used for the gate electrode 202 includes structures in which different materials are laminated, for example, polycide structures containing polysilicon and silicide or a polymetal structures containing polysilicon and a metal or structures containing a barrier metal and a metal. The gate electrode 202 is covered by a protective material 204.

Figure 6B:
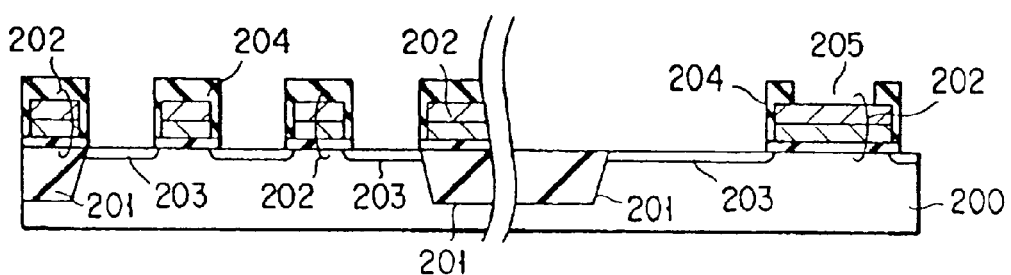

Next, as shown in FIG. 6B, an opening portion 205 is formed on a part of the protective material 204 formed on the gate electrode 202 using a usual lithography technique and an etching technique.

Figure 6C:
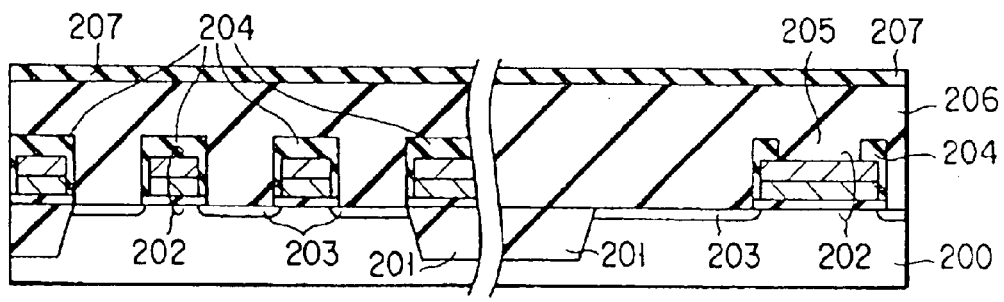

Then, as shown in FIG. 6C, an interlayer insulation film 206, e.g., a silicon oxide film, is deposited and a thin insulation film 207, e.g., a silicon nitride film, is further formed on the insulation film 206.

Figure 6D:
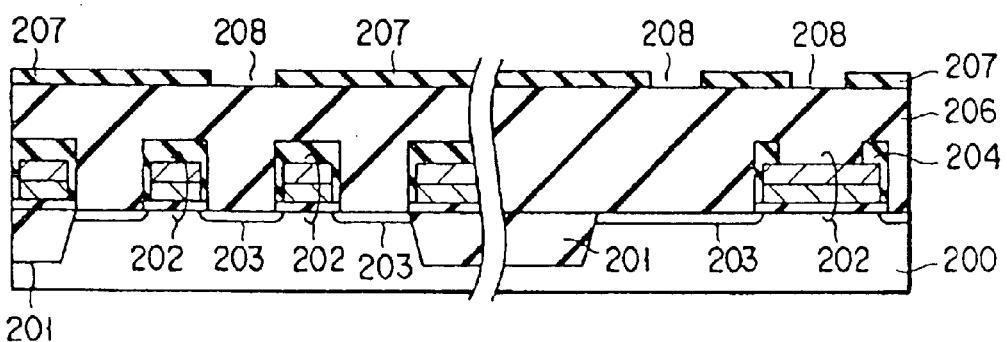

Next, as shown in FIG. 6D, the insulation film 207 of the part on which a contact hole will be formed is removed to form an opening portion 208 using a lithography technique and an etching technique.

Figure 6E:
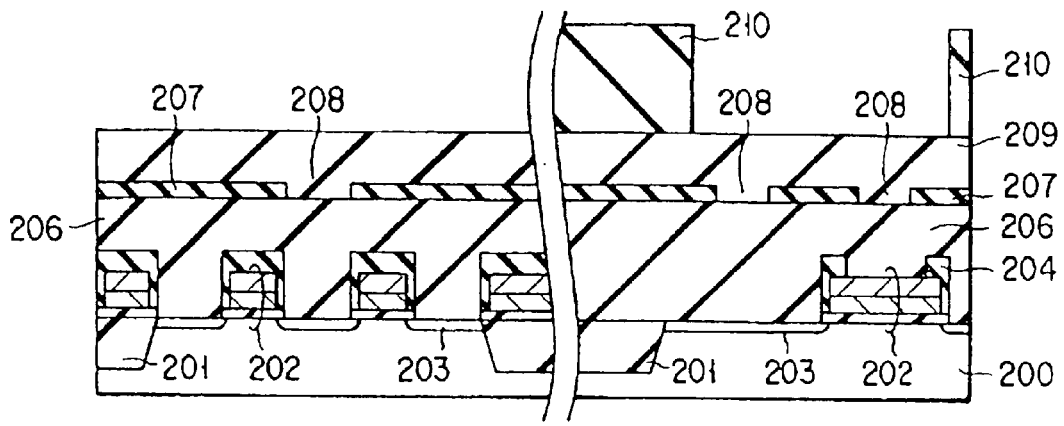

Then, as shown in FIG. 6E, an interlayer insulation film 209, e.g., a silicon oxide film, is deposited on the insulation films 207 and 206. After that, a resist film 210 is applied and thereafter the resist film 210 of the part on which a wiring groove will be formed is removed using a lithography technique. The removal of the resist film 210 involves removing the resist of the region on which a bit line groove of the memory region MC is to be formed.

Figure 6F:
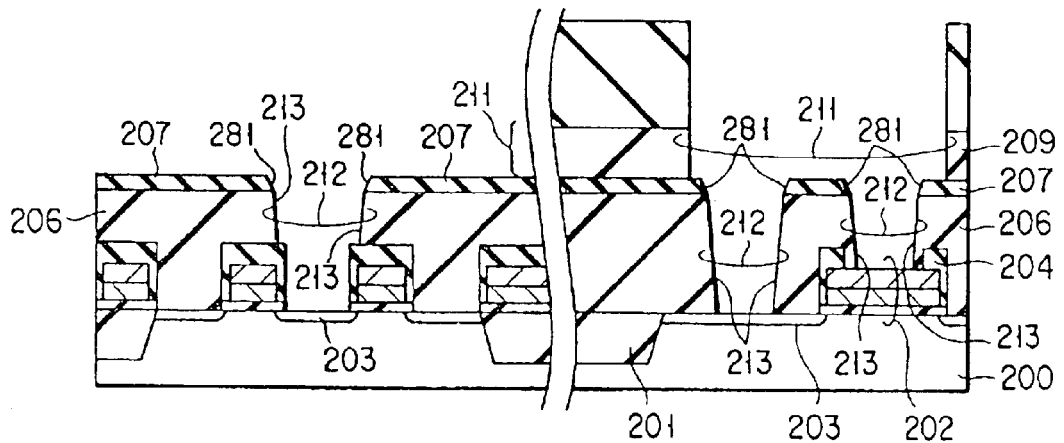

Next, as shown in FIG. 6F, using a selective etching technique, the insulation films 209 and 206 are removed in the condition that the insulation film 207 is scarcely etched. In this process, a wiring groove 211 is formed on the insulation film 209 portion. In this case, the bottom of the wiring groove 211 is defined by the insulation film 207.

In the above etching step, as viewed from above the semiconductor substrate 201, the insulation film 206 of the part where the wiring groove 211 is overlapped on the opening portion 208 is etched to form a contact hole 212. Here, in the present invention, the etching selectivity in the above selective etching technique is designed to be slightly lower.

In other words, the etching is made in the condition that the surface of the insulation film 207 is scarcely etched whereas a hole edge 281 of the opening portion 208 which is formed in the insulation film 207 is slightly etched.

In this manner, the etching selectivity of the insulation film 206 to the insulation film 207 is designed to be slightly lower whereby the hole edge 281 of the opening portion 208 which is exposed is gradually recessed during etching. This results in that the side wall portion 213 of the contact hole 212 can be provided with a substantial taper angle within the extent that the side wall portion is not protruded from a region defined by the wiring groove 211.

Figure 6G:
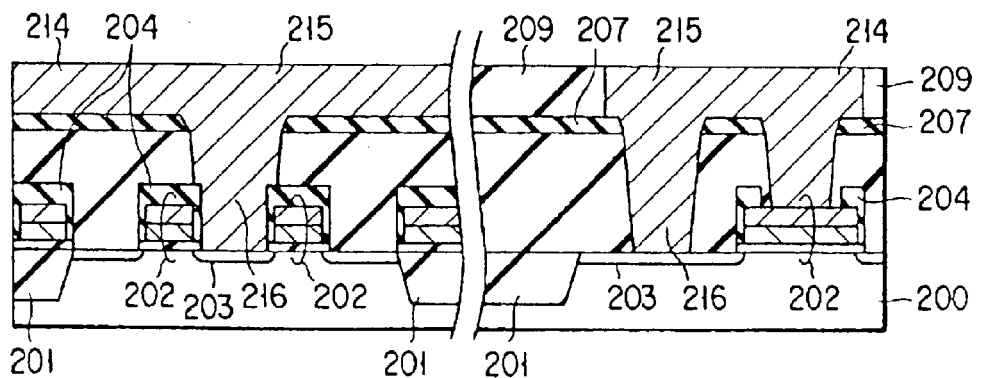

Next, as shown in FIG. 6G, the resist film 210 is removed and a conductive material 214 is deposited to embed the contact hole 212 and the wiring groove 211. Thereafter, the conductive material 214 above the insulation film 209 is removed using, for example, a CMP technique.

By the above process, a wiring layer 215 of the bit line and a contact plug 216 which connects the wiring layer 215 with each diffused layer 203 or the gate electrode 202 are formed at the same time. The protective material 204 may be formed of the same material, for example, a silicon nitride film, that is used for the insulation film 207. The protective material 204 is thicker than the insulation film 207. Therefore, even if the upper edge portion of the protective material 204 is etched, the reliability is never interfered.

In this embodiment, a capacitor of the DRAM is formed, for instance, in a layer formed above the wiring layer 215 of the bit line. Moreover, although a capacitor contact exists on a separate section, illustrations of these parts are omitted. The contact hole with the side wall tapered according to the present invention may be applied also to the capacitor contact and the contact formed in the upper layer.

The fifth embodiment has the same function and effect as in the aforementioned embodiments. Specifically, the embodiment of this invention has the structure in which the area of the bottom of each contact plug 216 (contact area with each diffused layer 203) is secured and at the same time the characteristics of embedding the conductive material 214 is improved. Also, since the side wall of the wiring groove 211 scarcely has a taper angle, a fine wiring interval can be kept. As a consequence, the possibility of developments of short circuits between wirings is reduced and hence a reduction in yield can be restrained. Also, further integration of a wiring region can be expected.

In this embodiment of the present invention, the wiring groove 211 is formed using a selective etching technique and the bottom of the wiring groove is defined by the insulation film 207. It is therefore easy to finish the bottom of the wiring groove 211 having various line widths flatly to a desired depth with the result that a variation in the sheet resistance of the conductive layer 214 can be restrained to a small level.

Further, the method of this embodiment has the following advantages. Contact holes for each elemental region (each diffused layers 203) of the memory cell region MC and the peripheral circuit region PC and contact holes above the gate electrode 205 are all formed at the same time.

The number of lithography steps of the production of a memory device can be reduced. Also, because no alignment error is caused, alignment errors to be considered in the subsequent steps can be reduced.

Since each contact hole 212 in FIG. 6F is formed so as to be self-aligned with wiring grooves so that it is not protruded from a region defined by the wiring groove 211 of the bit line, alignment errors to be considered in the subsequent steps can be further reduced.

FIGS. 7A to 7F are sectional views showing the steps of forming a semiconductor device according to a sixth embodiment of the present invention in order, for instance, showing a part of the production process of a DRAM. In the figure, MC represents a memory cell region and PC represents a peripheral circuit region.

Figure 7A:
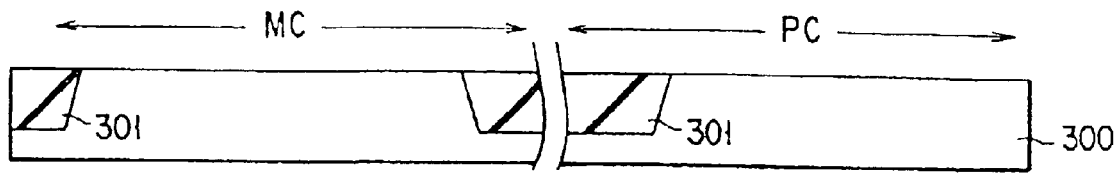
FIGS. 7A to 7F are sectional views showing the steps of manufacturing a semiconductor device in order according to a sixth embodiment of the present invention.

As shown in FIG. 7A, using a usual technology, an element isolated region 301 is formed on a semiconductor substrate 300. An element isolated region 301 is formed by, for instance, a trench element isolation method (STI).

Figure 7B:
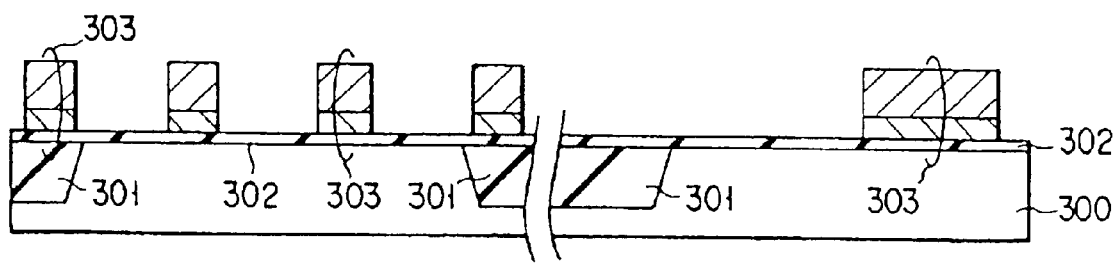

Next, as shown in FIG. 7B, a gate oxidation film 302 is formed on the substrate and a gate electrode 303 is formed on a given region using a usual lithography technique and etching technique. The gate electrode 303 has the structure produced by laminating different materials on the gate oxidation film 302 and has a polymetal structure such as a laminated film consisting of polysilicon and tungsten in this case.

Figure 7C:
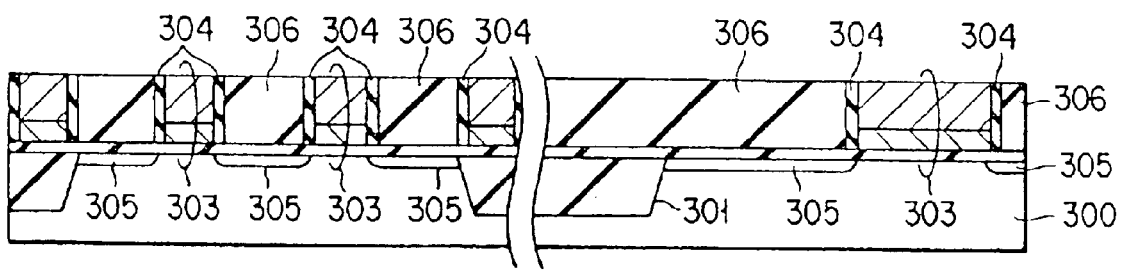

Then, as shown in FIG. 7C, a thin insulation film such as a silicon nitride film is deposited so as to cover the gate electrode 303. Thereafter, the insulation film is partly removed using an anisotropic etching technique, thereby forming a gate electrode side wall 304. After a diffused layer 305 including a source and a drain is formed, an insulation film 306, for example, a silicon oxide film, is deposited on the substrate and on the gate electrode 303. Then, the insulation film 306 is removed using, for example, a CMP method to planarize the insulation film 306 to a level corresponding to the height of the gate electrode 303.

Figure 7D:
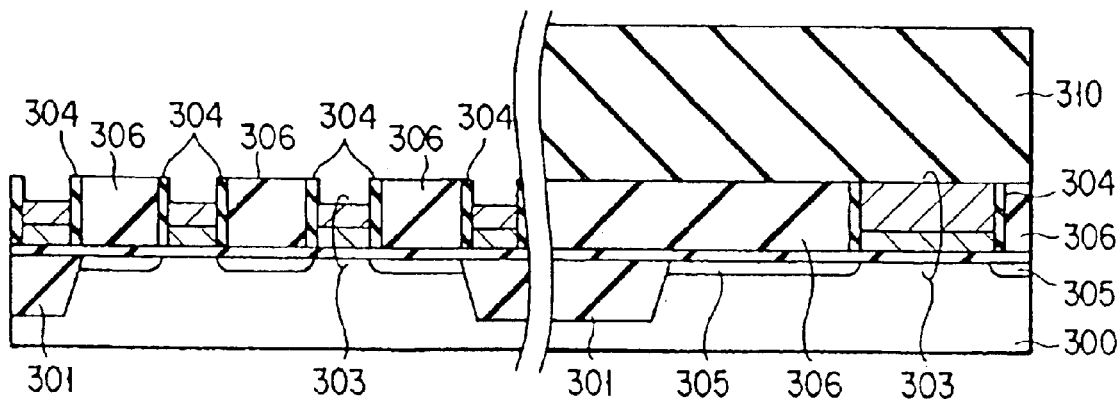

Then, as shown in FIG. 7D, the side of the peripheral circuit region PC is coated with a resist film 310 and then, in the side of the memory cell region MC, the conductive film above the gate electrode 303 is partly removed using a selective etching technique.

Figure 7E:
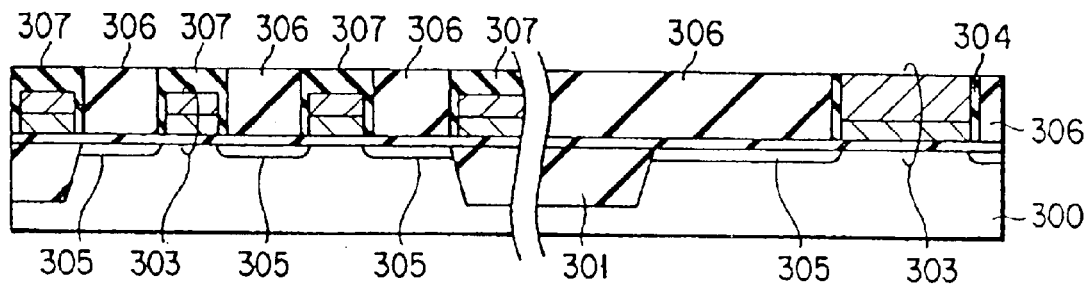

Next, as shown in FIG. 7E, the resist film 310 is released and then an insulation film 307, e.g., a silicon nitride film, is deposited so as to embed the above removed part above the gate electrode 303. Thereafter, using a CMP method, the insulation film 307 above the insulation film 306 is removed to planarize.

Figure 7F:
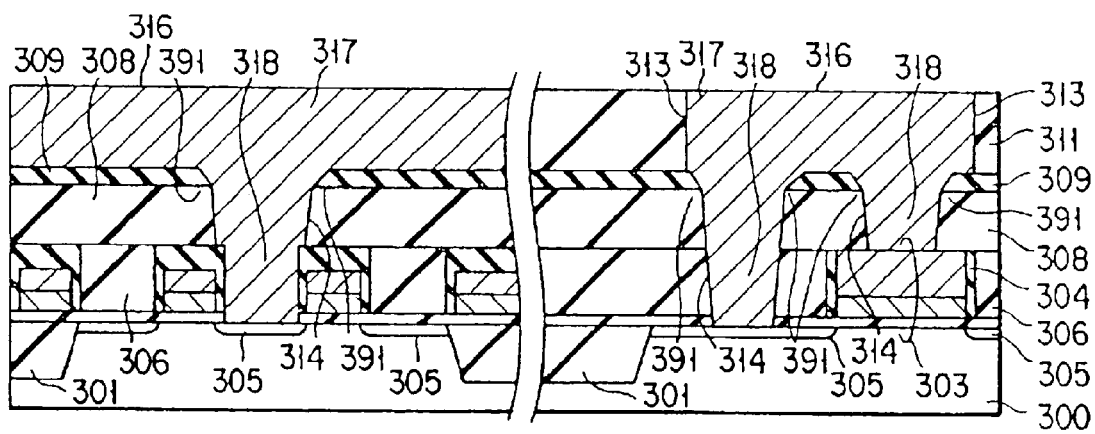

Then, as shown in FIG. 7F, an interlayer insulation film 308, such as a silicon oxide film, is deposited on the surface planarized as shown in FIG. 7E and then a thin insulation film 309, e.g., a silicon nitride film, is further deposited on the insulation film 308.

After that, the same steps as shown in FIG. 6D to FIG. 6G explained in the fifth embodiment are carried out to form the structure shown in FIG. 7F. Specifically, an insulation film 311 is selectively etched to form a wiring groove 313 and a contact hole 314 in which a prescribed side wall portion of the side on which a hole edge 391 of an insulation film 309 is gradually recessed by etching is provided with a taper angle. Furthermore, a contact plug 318 and a wiring layer 317 are formed by a conductive material 316 which is filled in the contact hole 314 and the wiring groove 313.

The function and effect of the sixth embodiment are the same as those of the fifth embodiment. The sixth embodiment further has the following advantages. Specifically, in the fifth embodiment, as for the position where the contact plug 216 is formed, it is essential to perform the step of forming the opening portion 205 in advance on the gate electrode 202. However, this step is not essential in the sixth embodiment.

In the sixth embodiment, a simple lithography step of separating the memory cell region MC from the peripheral circuit region PC is added to form a cap for the insulation film 307 only in the side of the memory cell region MC with a small distance between gate electrodes and to secure sufficient conductive film thickness for the peripheral circuit region PC with a large distance between gate electrodes. A micronization of the memory cell region MC and an improvement in the circuitry operation speed of the peripheral circuit region PC can be thereby achieved at the same time.

In the above each embodiment, no difference in level is found on the surfaces of the wiring groove and contact hole in the lithography step and accurate result of lithography can be obtained. Also, the contact hole is formed so as to be self-aligned with the wiring groove. Further, the side wall portion of the contact hole can be provided with a substantial taper angle within the extent that it is not protruded from a region defined by the wiring width defined by the wiring groove with the characteristics of embedding a conductive material being improved.

In the above each embodiment, such a function and effect can be obtained without increasing process steps compared with prior art technologies. The aforementioned technologies of the present invention are suitable to highly micronize a semiconductor device, to improve yield and to simplify a process of the production of a semiconductor device.

The present invention focused on the structure itself of a contact plug formed by embedding a conductive material in a contact hole. Along with the micronization, it comes to be difficult in prior art technologies to form a structure which is superior in all of the contact resistance, reaction barrier qualities and metal embedding characteristics and hence some ideas are being sought.

In light of this, a discussion will be followed as to a highly reliable contact plug structure which satisfies the contact resistance, barrier qualities and metal-embedding characteristics even if high micronization is progressed.

FIGS. 8A to 8F respectively are sectional views showing a method for producing a contact plug in order of step according to a seventh embodiment of a semiconductor device of the present invention. In this embodiment, W (tungsten) is used for a conductive film of the contact plug and TiN (titanium nitride) is used as a barrier metal for preventing the reaction of a silicon substrate with tungsten.

Figure 8A:
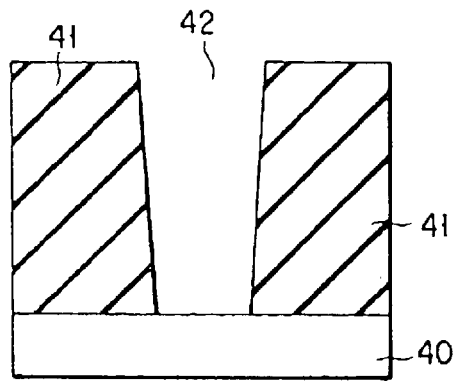
FIGS. 8A to 8F are sectional views showing the steps of a method for manufacturing a contact plug in order according to a seventh embodiment of the present invention.

As shown in FIG. 8A, an insulation film 41 is formed on a substrate 40 including diffused layers and the like. A contact hole 42 is opened in the insulation film 41 using a lithography technique and an etching technique. This contact hole 42 may be the same as those formed at the same time when the wiring groove is formed in the aforementioned each embodiment.

Figure 8B:
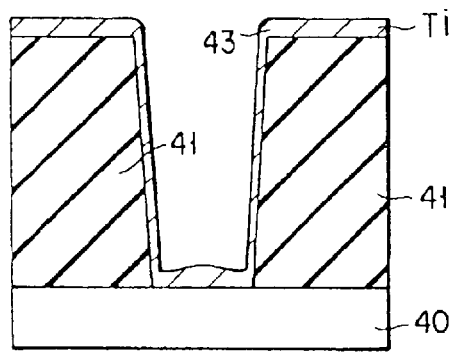

Next, as shown in FIG. 8B, a first Ti (titanium) film 43 is deposited on the main surface by an anisotropic sputtering method typified by an IMP-sputtering method (Ion-Metal-Plasma sputtering).

Figure 8C:
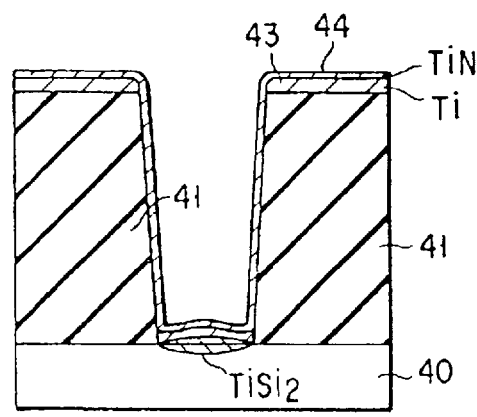

Then, as shown in FIG. 8C, the surface of the Ti film 43 is changed to TiN (titanium nitride) (TiN film 44) by annealing in a nitrogen atmosphere, for instance, using a thermal nitrifying method. At this time, TiSi2 (titanium silicide) is formed at the boundary between the substrate and Ti which is brought into contact with the substrate under the contact hole bottom.

Figure 8D:
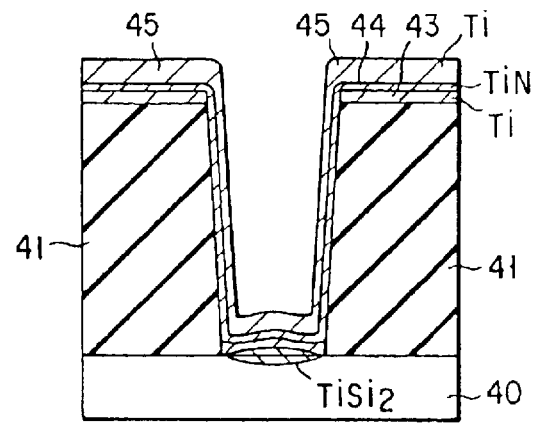
Figure 8E:
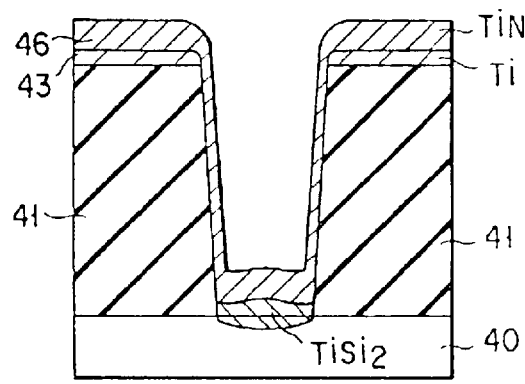

Next, as shown in FIG. 8D, anisotropic sputtering, e.g., IMP sputtering, is repeated to deposit a second Ti film 45 further on the TiN film 44. Thereafter, as shown in FIG. 8E, the substrate is annealed in a nitrogen atmosphere to change the second Ti film 45 to a TiN film 46. In this case, Ti, if does not react in the step shown in FIG. 8C, is changed to $TiSi_2$ on the bottom of the contact hole.

The thickness of the Ti film 43 to be formed is optionally determined according to the level to which the resistance of the contact hole bottom is reduced and the thickness of the Ti film 45 (or TiN film 46) is determined according to the level of the barrier qualities of the contact hole bottom.

Figure 8F:
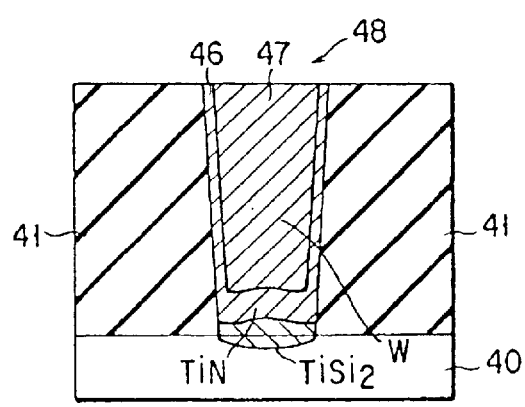

Then, as shown in FIG. 8F, a conductive material 47, e.g., W (tungsten), is embedded in the contact hole 42. Thereafter, W above the insulation film 41 and the barrier metal materials (46, 43) are removed using, for example, a CMP method, thereby forming a contact plug 48.

Although TiN is used for the barrier metal in the seventh embodiment, barrier metals other than TiN may be adopted in the present invention. The seventh embodiment has the following advantages.

Firstly, as shown in FIG. 8B and FIG. 8D, the Ti films 43 and 45 which are the bases of the barrier metal material are resulted from repeated anisotropic deposition and hence there is almost no deposition on the side wall of the contact hole. The method according to this embodiment may be said to be a method for ensuring the volume of a conductive film (W in this case) with low resistance in the contact hole with ease even in the case where significant progress in miniaturization is made in the future.

Secondarily, in the contact plug 48, the contact resistance and the barrier qualities can be optimized independently by controlling the thickness of the Ti film 43 and the thickness of the second Ti film 45 (or TiN film 46) respectively.

Thirdly, Ti having coatability higher than TiN is deposited by sputtering (see FIG. 8B) on the contact hole bottom and hence sufficient barrier qualities can be exhibited even at the bottom edge of the contact.

Fourthly, as shown in FIGS. 8C and 8E, thermally nitrified titanium is used for the TiN films 44 and 46. This thermally nitrified titanium is superior in film quality to titanium nitride formed using a sputtering method. An improvement in the barrier qualities is thereby expected.

FIGS. 9A to 9F are sectional views showing a method for producing a contact plug in order of step according to an eighth embodiment of a semiconductor device of the present invention. In this embodiment, W (tungsten) is used for a conductive film of the contact plug and TiN (titanium nitride) is used as a barrier metal for preventing the reaction of a silicon substrate with tungsten.

Figure 9A:
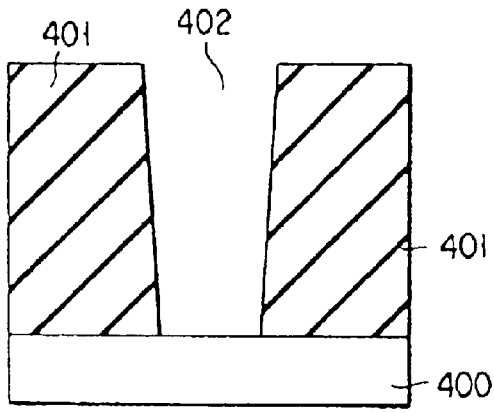
FIGS. 9A to 9F are sectional views showing the steps of a method for manufacturing a contact plug in order according to an eighth embodiment of the present invention.

As shown in FIG. 9A, an insulation film 401 is formed on a substrate 400 including diffused layers and the like. A contact hole 402 is opened in the insulation film 401 by using a lithography technique and an etching technique. This contact hole 402 may be the same as those formed at the same time when the wiring groove is formed in the aforementioned each embodiment.

Figure 9B:
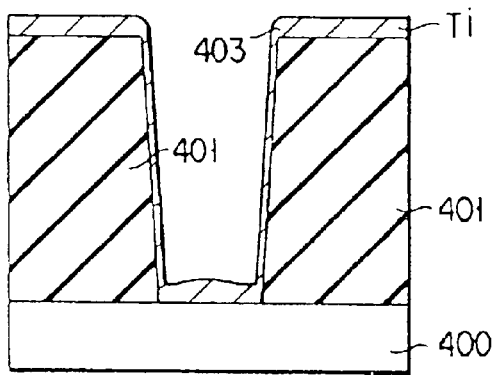

Next, as shown in FIG. 9B, a first Ti (titanium) film 403 is deposited on the main surface by an anisotropic sputtering method typified by an IMP-sputtering method (Ion-Metal-Plasma sputtering).

Figure 9C:
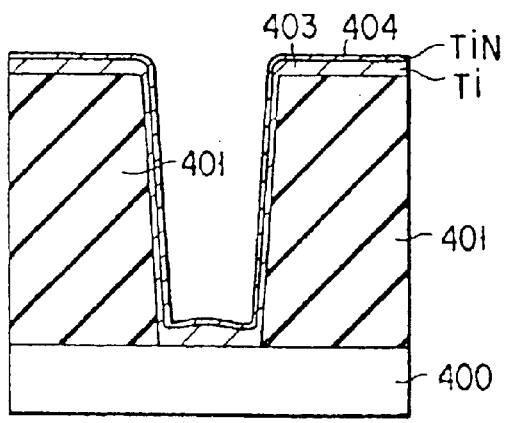
Figure 9D:
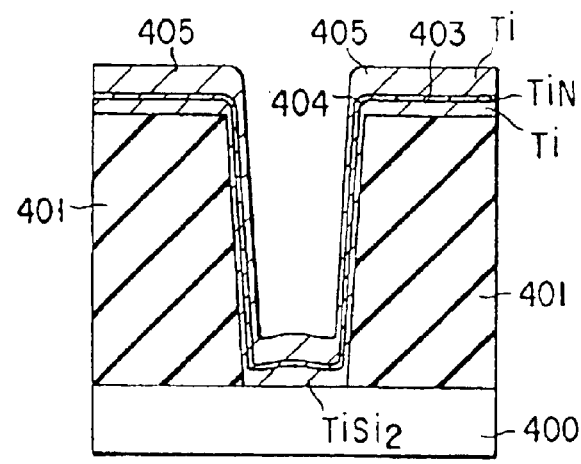

Then, as shown in FIG. 9C, an extremely thin TiN film 404 is deposited on the surface of the Ti film 403 by a sputtering method or a CVD method. Thereafter, as shown in FIG. 9D, anisotropic sputtering, e.g., IMP sputtering, is repeated to deposit a second Ti film 405 further on the TiN film 404.

Figure 9E:
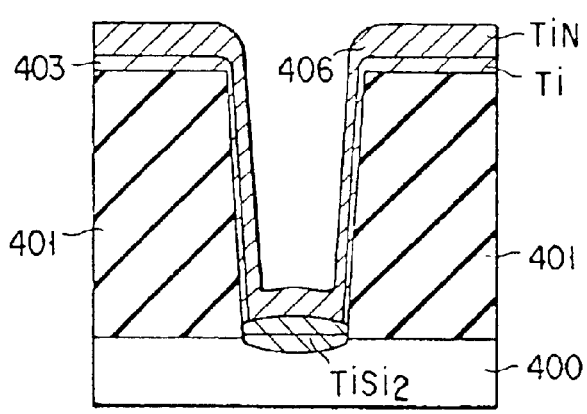

Next, as shown in FIG. 9E, the second Ti film 405 is changed to a TiN film 406 by annealing in a nitrogen atmosphere. At this time, the Ti film 403 on the bottom of the contact hole is changed to TiSi2.

The thickness of the first Ti film 403 to be formed is optionally determined according to the level to which the resistance of the contact hole bottom is reduced and the thickness of the second Ti film 405 (or TiN film 406) is determined according to the level of the barrier qualities of the contact hole bottom.

Figure 9F:
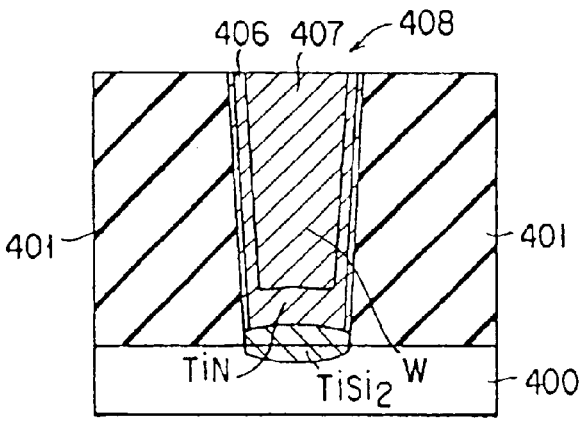

Then, as shown in FIG. 9F, a conductive material 407, e.g., W (tungsten), is embedded in the contact hole 402. Thereafter, W and the barrier metal materials (406, 403) above the insulation film 401 are removed using, for example, a CMP method, thereby forming a contact plug 408.

Although TiN is used for the barrier metal in the eighth embodiment, barrier metals other than TiN may be adopted in the present invention. The eighth embodiment has the following advantages.

Firstly, as shown in FIGS. 9B and 9D, the Ti films 403 and 405 which are the bases of the barrier metal material are resulted from repeated anisotropic deposition and hence there is almost no deposition on the side wall of the contact hole. The method according to this embodiment may be said to be a method for ensuring the volume of a conductive film (W in this case) with low resistance in the contact hole with ease even in the case where an outstanding progress in micronization is made in the future.

Secondarily, in the contact plug 408, the contact resistance and the barrier qualities can be optimized independently by controlling the thickness of the first Ti film 403 and the thickness of the second Ti film 405 (or TiN film 406) respectively.

Thirdly, Ti having coatability higher than TiN is deposited by sputtering (see FIG. 9B) on the contact hole bottom and hence sufficient barrier qualities can be exhibited even at the bottom edge of the contact.

Fourthly, the deposition of the extremely thin TiN film 404 (see FIG. 9C) is made using a sputtering method, CVD method or the like and hence can be attained at a temperature lower than in the seventh embodiment. This contributes to a reduction in thermal steps and shortening of steps.

Fifthly, as shown in FIG. 9E, thermally nitrified titanium is used for the TiN film 406. This thermally nitrified titanium is superior in film quality to titanium nitride formed using a sputtering method. An improvement in the barrier qualities is thereby expected.

FIGS. 10A to 10G are sectional views showing a method for producing a contact plug in order of step according to a ninth embodiment of a semiconductor device of the present invention. This embodiment relates to the structure of a contact plug which connects an underlying polycide wiring layer with an upper metal wiring layer. In this embodiment, W (tungsten) is used for a conductive film of the contact plug and metal wiring and TiN (titanium nitride) is used as a barrier metal for preventing the reaction of the polycide wiring layer with tungsten.

Figure 10A:
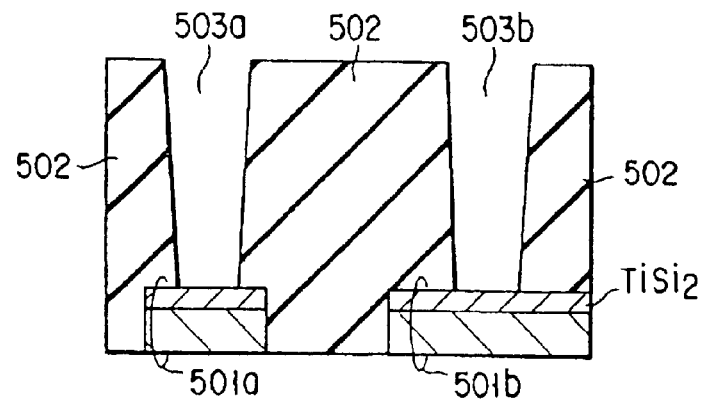
FIGS. 10A to 10G are sectional views showing the step of a method for manufacturing a contact plug in order according to a ninth embodiment of the present invention.

As shown in FIG. 10A, polycide wiring layers 501a, 501b formed of a laminated layer consisting of polysilicon and TiSi2 (titanium silicide) are formed as the (n)th layer (n is a natural number) on a semiconductor substrate (not shown). An insulation film 502 with which these wiring layers 501a, 501b are coated is deposited. The insulation film 502 is processed using a lithography technique and an etching technique to open contact holes 503a, 503b extending to the upper portions of the wiring layers 501a, 501b respectively.

Figure 10B:
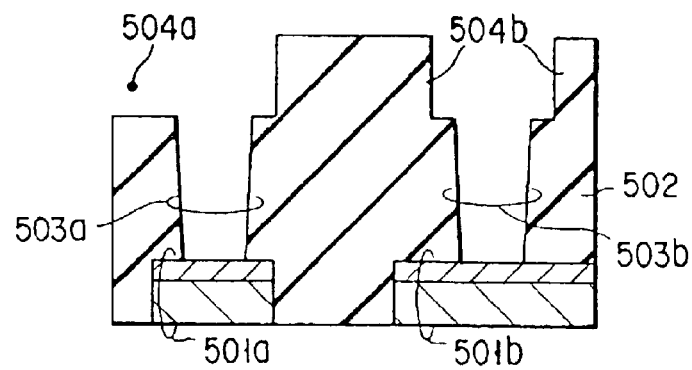

Next, as shown FIG. 10B, wiring grooves 504a, 504b which will be damascene wiring layers are formed using a lithography technique and an etching technique. It is noted that these wiring grooves 504a, 504b and contact holes 503a, 503b can be formed at the same time if the techniques indicated in the first to sixth embodiments are used.

Figure 10C:
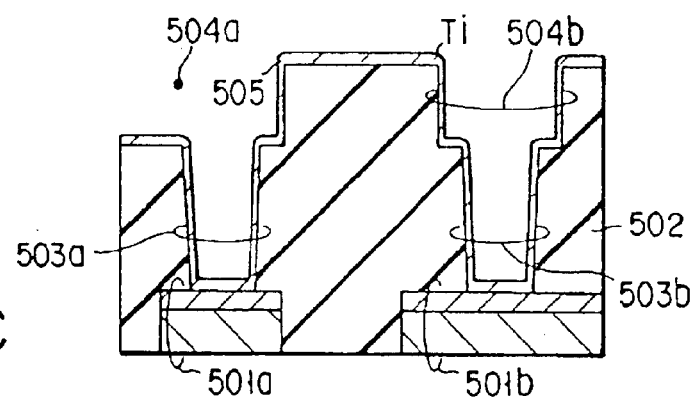

Next, as shown in FIG. 10C, a first Ti (titanium) film 505 is deposited on the main surface by an anisotropic sputtering method typified by an IMP-sputtering method (Ion-Metal-Plasma sputtering).

Figure 10D:
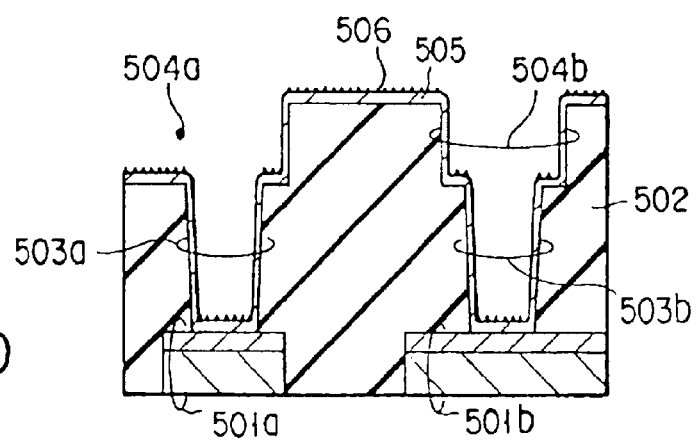

Then, as shown in FIG. 10D, a thin TiN (titanium nitride) film 506 is formed on the surface of the Ti film 505 by, for example, nitrogen plasma treatment. It is noted that the TiN film 506 can be formed in a larger thickness by repeating a step of depositing a new thin Ti film and a step of nitrogen plasma treatment.

Figure 10E:
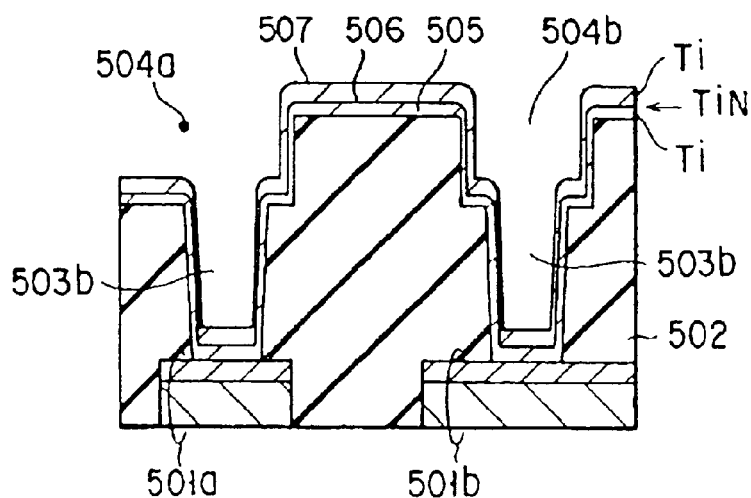
Figure 10F:
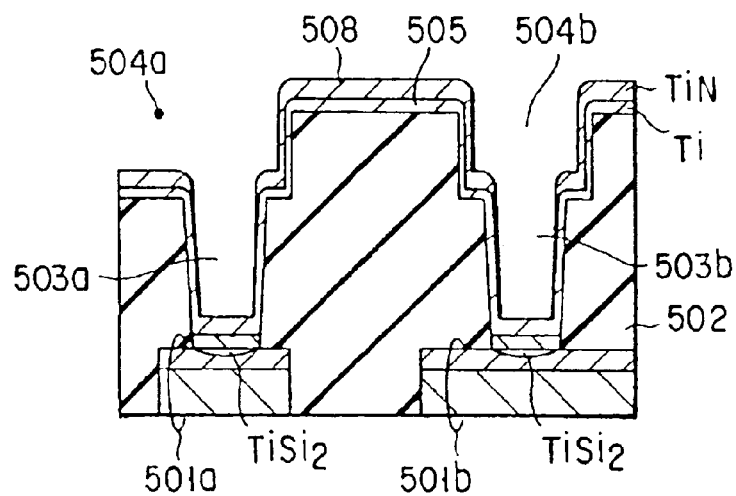

Then, as shown in FIG. 10E, anisotropic sputtering, e.g., IMP sputtering, is repeated to deposit a second Ti film 507 further on the TiN film 506. Thereafter, as shown FIG. 10F, the second Ti film 507 is changed to a TiN film 508 by annealing in a nitrogen atmosphere. At this time, a part remaining unreacted in the first Ti film 505 on the bottom of the contact hole is changed to TiSi2.

The thickness of the first Ti film 505 to be formed is optionally determined according to the level to which the resistance of the contact hole bottom is reduced and the thickness of the second Ti film 507 (or TiN film 508) is determined according to the level of the barrier qualities of the contact hole bottom.

Figure 10G:
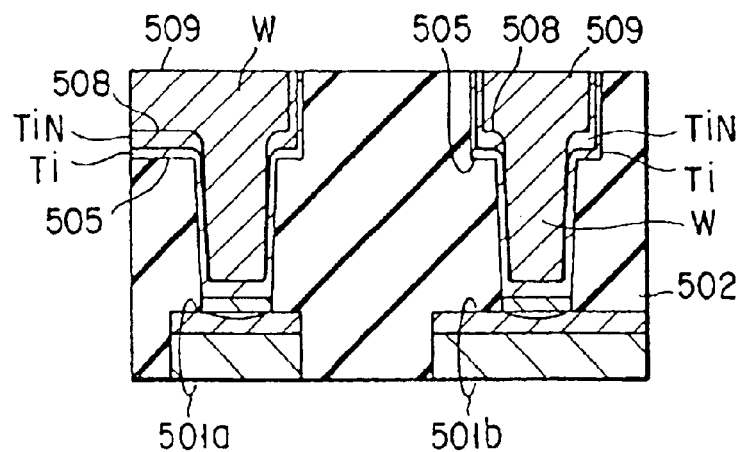

Then, as shown in FIG. 10G, a conductive material 509, e.g., W (tungsten), is embedded in the contact holes 503a, 503b and the wiring grooves 504a, 504b. Thereafter, W and the barrier metal materials (508, 505) above the insulation film 502 are removed using, for example, a CMP method, thereby forming a contact plug 510 and a damascene wiring layer 511 at the same time.

Although TiN is used for the barrier metal in the ninth embodiment, barrier metals other than TiN may be adopted in the present invention. The ninth embodiment has the following advantages.

Firstly, as shown in FIG. 10C and FIG. 10E, the Ti films 505 and 507 which are the bases of the barrier metal material are resulted from repeated anisotropic deposition and hence there is almost no deposition on the side wall of the contact hole. The method according to this embodiment may be said to be a method for ensuring the volume of a conductive film (W in this case) with low resistance in the contact hole with ease even in the case where micronization is highly progressed in the future.

Secondarily, in the contact plug 510, the contact resistance and the barrier qualities can be optimized independently by controlling the thickness of the first Ti film 505 and the thickness of the second Ti film 507 (or TiN film 508) respectively.

Thirdly, Ti having coatability higher than TiN is deposited by sputtering (see FIG. 10C) on the contact hole bottom and hence sufficient barrier qualities can be exhibited even at the bottom edge of the contact.

Fourthly, the surface of the first Ti film 505 is nitrided by nitrogen plasma treatment (see FIG. 10D). This makes it possible to attain a reduction in thermal steps and shortening of steps.

As to the TiN film 506, such a formation method as shown in FIG. 9C may be adopted. Specifically, an extremely thin TiN film 506 is deposited on the surface of the Ti film 505 by using a technique such as a sputtering method or a CVD method. In this case, also the TiN film 506 can be formed at temperatures lower than that in the seventh embodiment. This contributes to a reduction in thermal steps and shortening of steps.

FIGS. 11A to 11G are sectional views showing a method for producing a contact plug in order of step according to a tenth embodiment of a semiconductor device of the present invention. This embodiment relates to the structure of a contact plug which connects an underlying polycide wiring layer with an upper metal wiring layer. Applying such a technique as shown in the first to sixth embodiments, a wiring groove and a contact hole are formed at the same time. W (tungsten) is used for a conductive film of the wiring layer, contact plug and metal wiring and TiN (titanium nitride) is used as a barrier metal for preventing the reaction of the polycide wiring layer with tungsten.

Figure 11A:
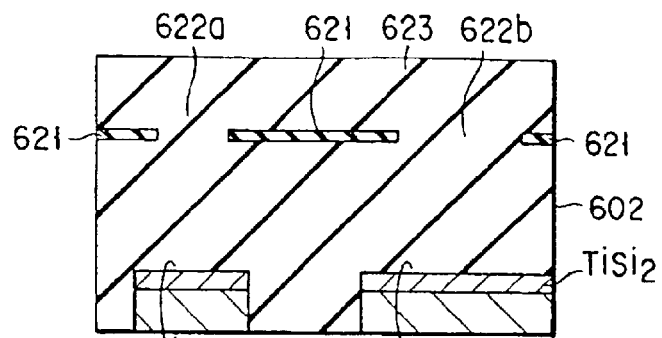
FIGS. 11A to 11G are sectional views showing the steps of a method for manufacturing a contact plug in order according to a tenth embodiment of the present invention.

As shown in FIG. 11A, polycide wiring layers 601a, 601b formed of a laminated layer consisting of polysilicon and TiSi2 (titanium silicide) are formed as the (n)th layer (n is a natural number) on a semiconductor substrate (not shown). A first insulation film 602 consisting of, for example, a silicon oxide film, is formed on these wiring layers 601a, 601b.

On the first insulation film 602, a thin second insulation film 621 consisting of a film, e.g., silicon nitride film, which is different in etching rate from the insulation film 602 is deposited. Using a lithography technique and a selective etching technique, opening portions 622a, 622b including each region extending in a direction perpendicular to the substrate from prescribed regions including the upper surfaces of the underlying wiring layers 601a, 601b respectively are formed in the insulation film 621.

On the first insulation film 602 and second insulation film 621, a third insulation film 623 which differs in etching rate from the insulation film 621 and may be the same silicon oxide film as used for the insulation film 602 is deposited.

Figure 11B:
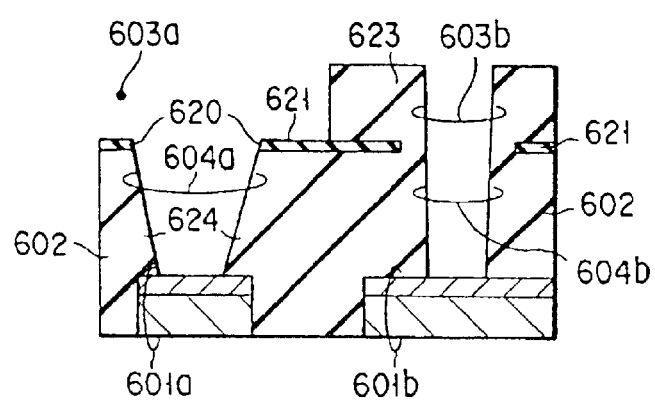

Next, as shown in FIG. 11B, wiring grooves 603a, 603b which will be damascene wiring layers and contact holes 604a, 604b are formed on the insulation film 623 by using a lithography technique and a selective etching technique.

Each depth of these wiring grooves 603a, 603b is defined by the position of the insulation film 621. The region of the opening portion 622 of the insulation film 621 which is simultaneous in terms of etching with these wiring grooves 603a, 603b extends, further into the first insulation film 602 by etching, with the result that each upper portion of the wiring layers 601a, 601b are exposed (contact holes 604a, 604b).

In addition, the etching selectivity in the above selective etching technique is designed to be slightly lower. In other word, the etching is made in the condition that the surface of the insulation film 621 is scarcely etched whereas a hole edge 620 of the opening portion 622a which is formed in the insulation film 621 is slightly etched.

In this manner, the etching selectivity of the first insulation film 602 to the second insulation film 621 is designed to be slightly lower whereby the hole edge 620 of the opening portion 622a which is exposed is gradually recessed during etching. This results in that a side wall portion 624 of the contact hole 604a can be provided with a substantial taper angle within the extent that the side wall portion is not protruded from a region defined by the wiring groove 603a.

The wiring groove 603b is supposed to be formed in the direction perpendicular to the section indicated in FIG. 11. In the wiring groove 603b, therefore the hole edge of the opening portion 622b formed in the second insulation film 621 is exposed on a section (not shown) perpendicular to the indicated section to provide the side wall portion of the contact hole 604b with a taper angle. On this section, the contact hole 604b has substantially a shape in accordance with the etching of the wiring groove 603b.

Figure 11C:
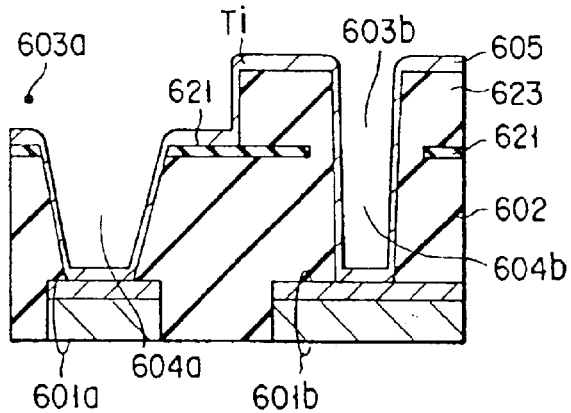

Next, as shown in FIG. 11C, a first Ti (titanium) film 605 is deposited on the main surface by an anisotropic sputtering method typified by an IP-sputtering method (Ion-Metal-Plasma sputtering).

Figure 11D:
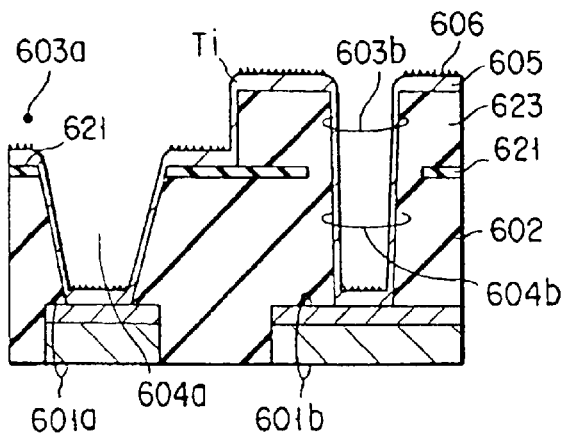

Then, as shown in FIG. 11D, a thin TiN (titanium nitride) film 606 is formed on the surface of the Ti film 605 by, for example, nitrogen plasma treatment. It is noted that the TiN film 606 can be formed in a larger thickness by repeating a step of depositing a new thin Ti film and a step of nitrogen plasma treatment. Furthermore, the TiN film 606 may be formed by depositing an extremely thin TiN film by a sputtering method, CVD method or the like (see FIG. 9C).

Figure 11E:
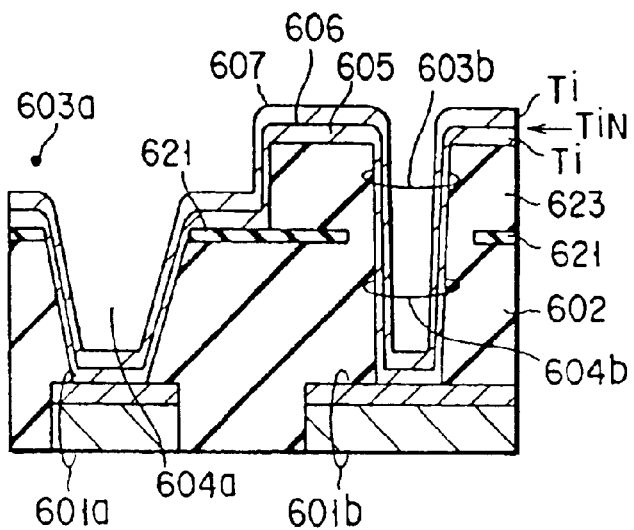

Next, as shown in FIG. 11E, anisotropic sputtering, e.g., IMP sputtering, is repeated to deposit a second Ti film 607 further on the TiN film 606. The thickness of the first Ti film 605 to be formed is optionally determined according to the level to which the resistance of the contact hole bottom is reduced and the thickness of the second Ti film 607 (or TiN film 608) is determined according to the level of the barrier qualities of the contact hole bottom.

Figure 11F:
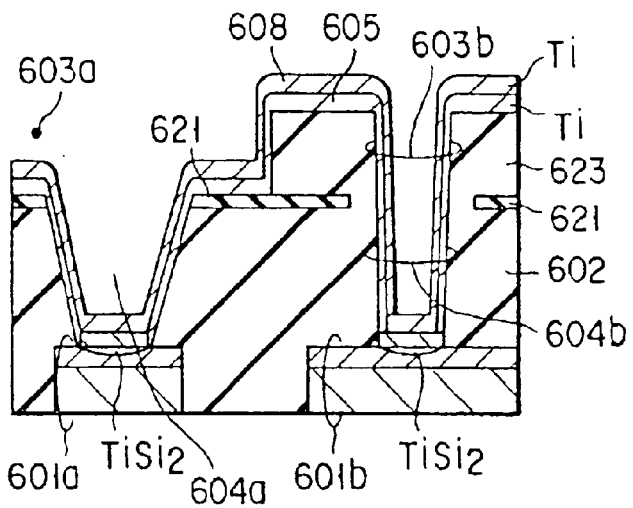

Next, as shown in FIG. 11F, the substrate is annealed in a nitrogen atmosphere to change the second Ti film 607 to a TiN film 608. At this time, a part remaining unreacted in the first Ti film 605 on the contact hole bottom will be converted into TiSi2.

Figure 11G:
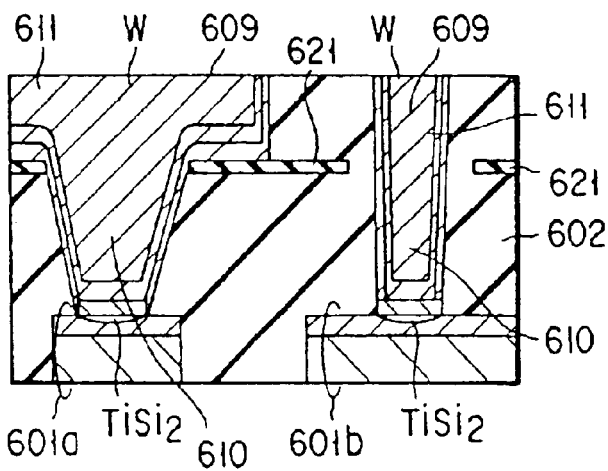
Figure 12A:
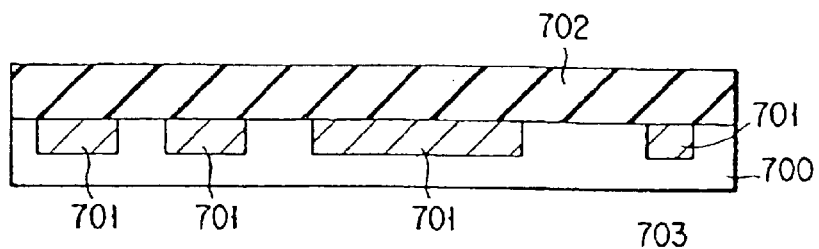
FIGS. 12A to 12F are sectional views showing the steps of a method for manufacturing a contact wiring structure in order to explain a first conventional example.
Figure 12B:
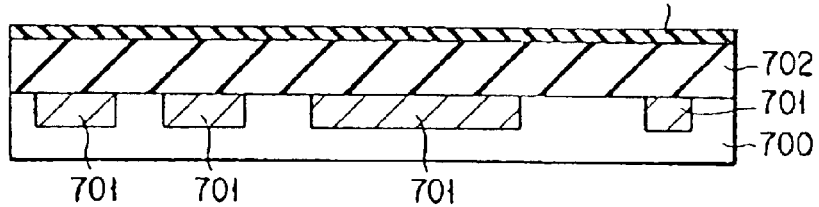
Figure 12C:
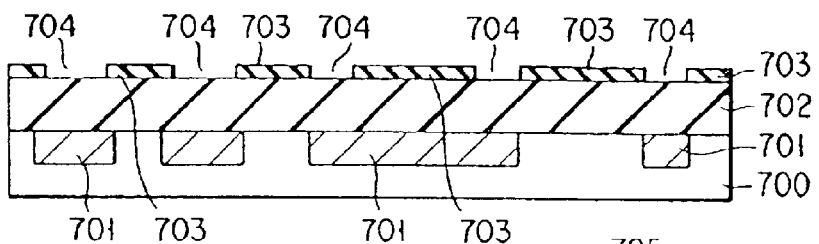
Figure 12D:
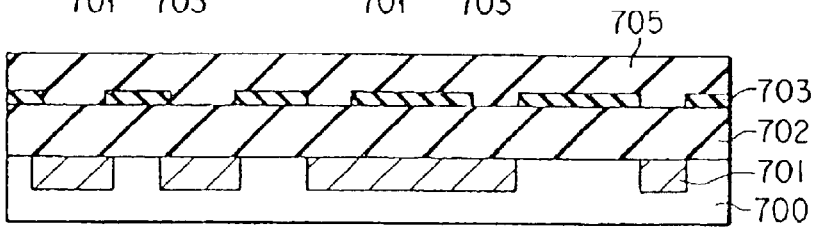
Figure 12E:
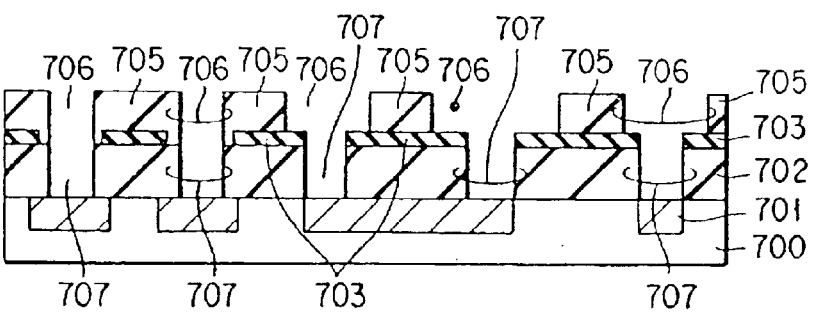
Figure 12F:
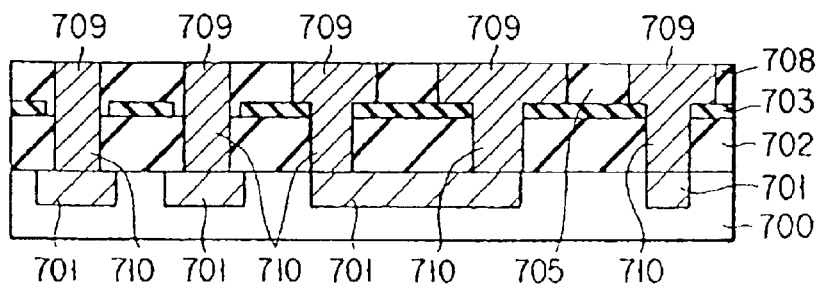
Figure 13:
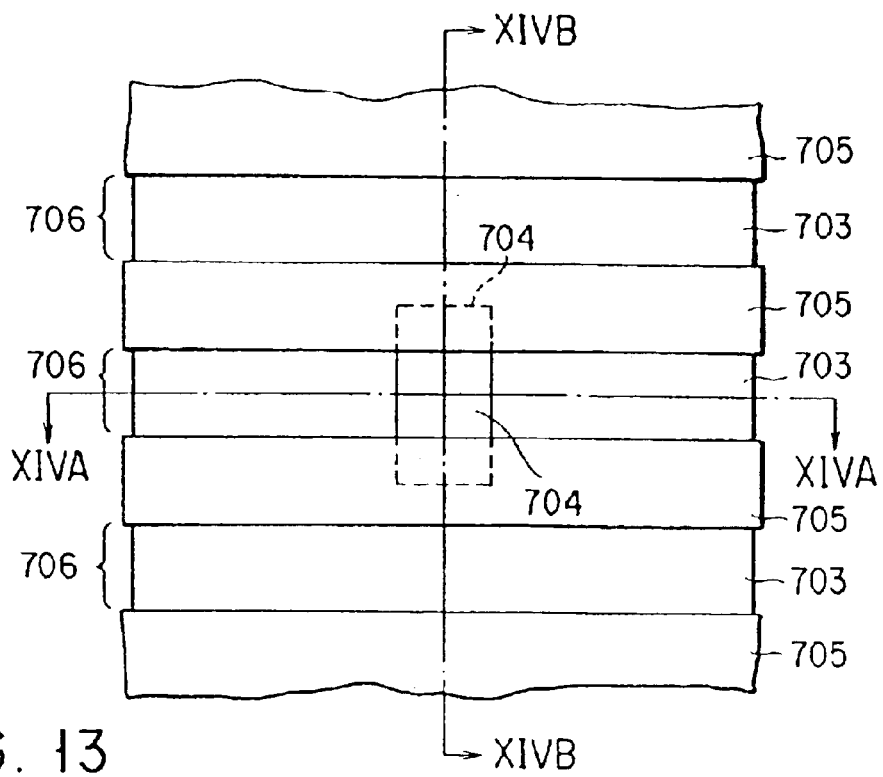
FIG. 13 is a top plan view showing a wiring groove and a contact hole for explaining the problems concerning a manufacturing method such as the first conventional example.
Figure 14A:
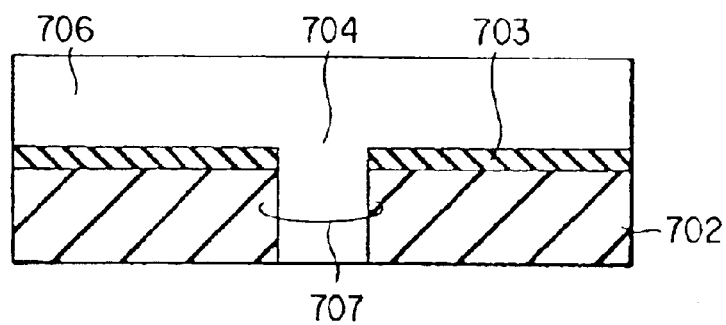
FIGS. 14A and 14B are sectional views along the line XIVA—XIVA and the line XIVB—XIVB respectively in FIG. 13.
Figure 14B:
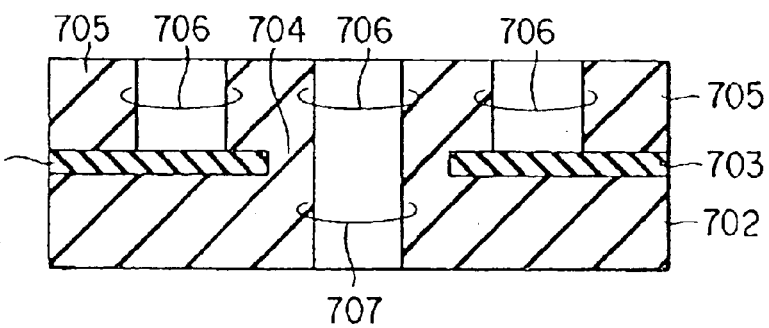
Figure 15:
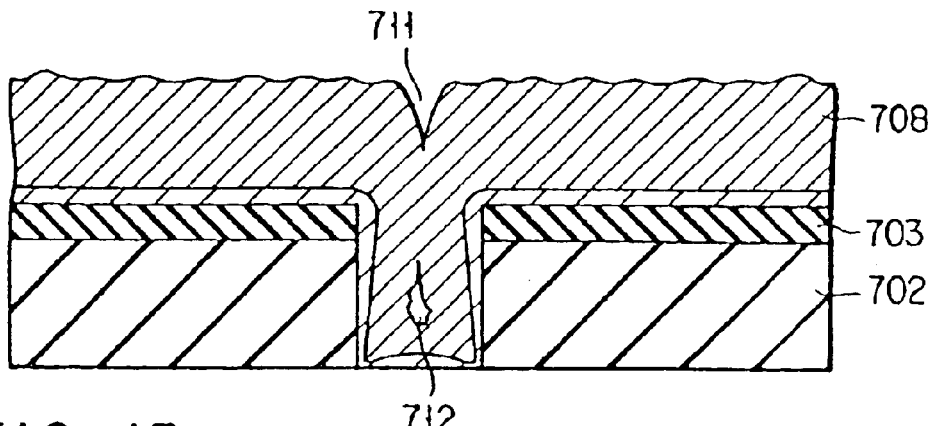
FIG. 15 is a sectional view showing the condition that a conductive material is embedded in a contact hole in the sectional view of FIG. 14A.
Figure 16A:
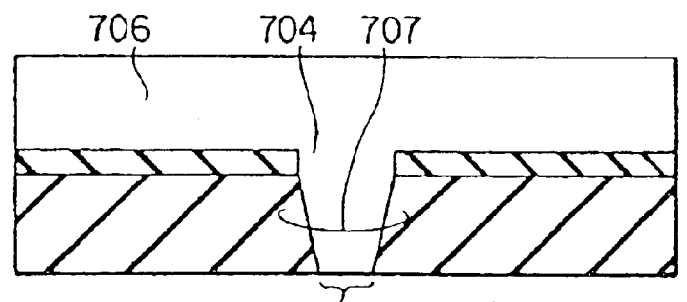
FIGS. 16A and 16B are sectional views showing modifications corresponding to FIGS. 14A and 14B respectively.
Figure 16B:
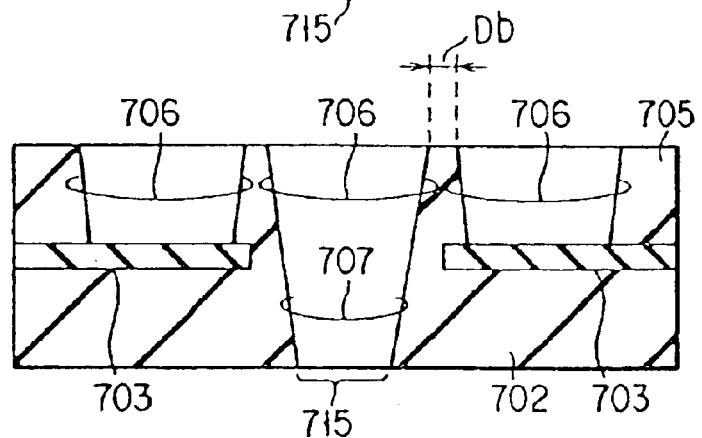
Figure 17A:
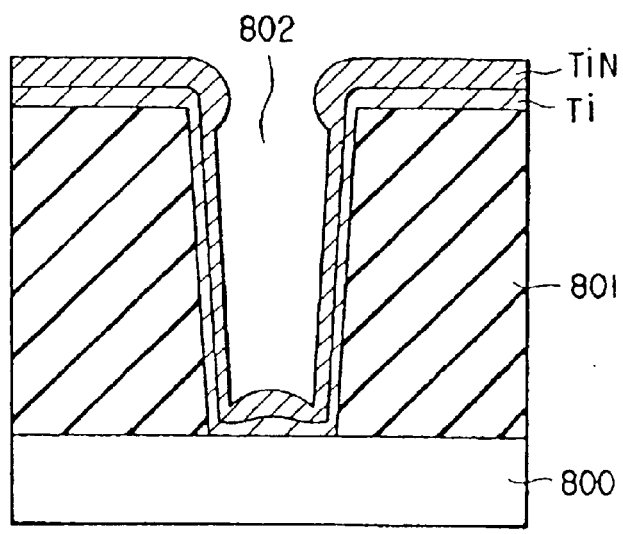
FIGS. 17A to 17C are sectional views showing the steps of a method for manufacturing a contact plug on a Si substrate in order to explain a second conventional example.
Figure 17B:
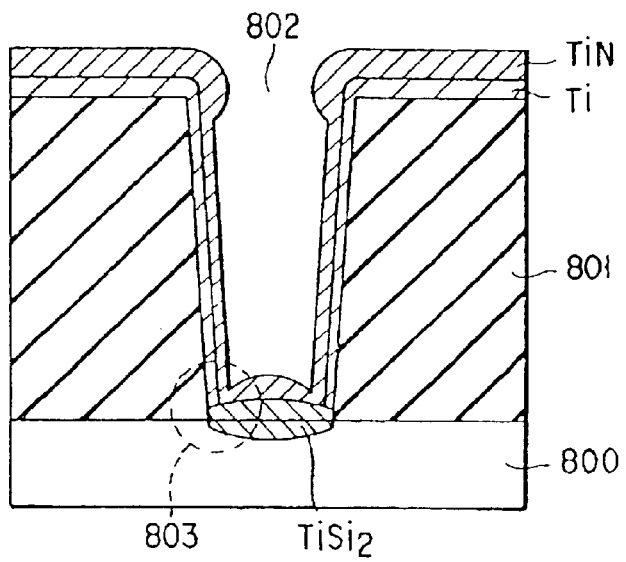
Figure 17C:
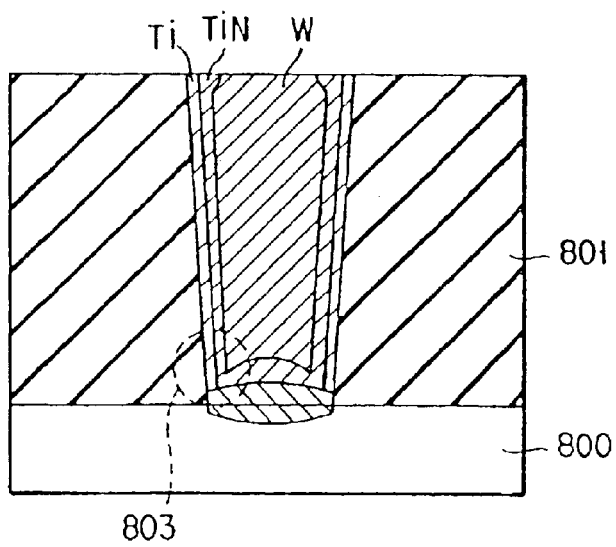
Figure 18A:
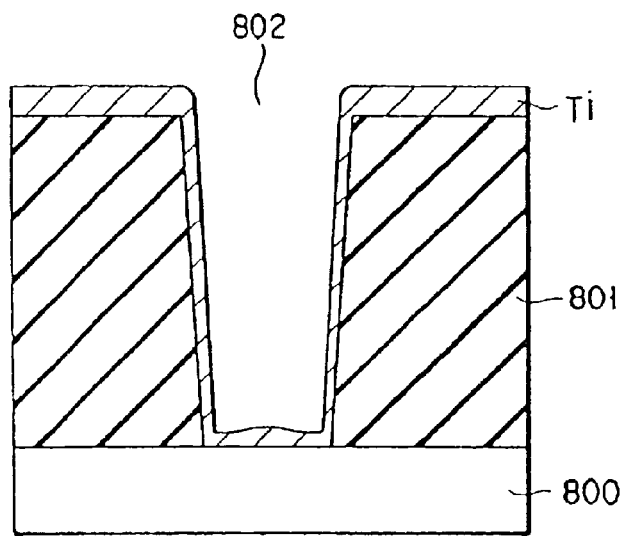
FIGS. 18A to 18C are sectional views showing the steps of a method for manufacturing a contact plug on a Si substrate in order to explain a third conventional example.
Figure 18B:
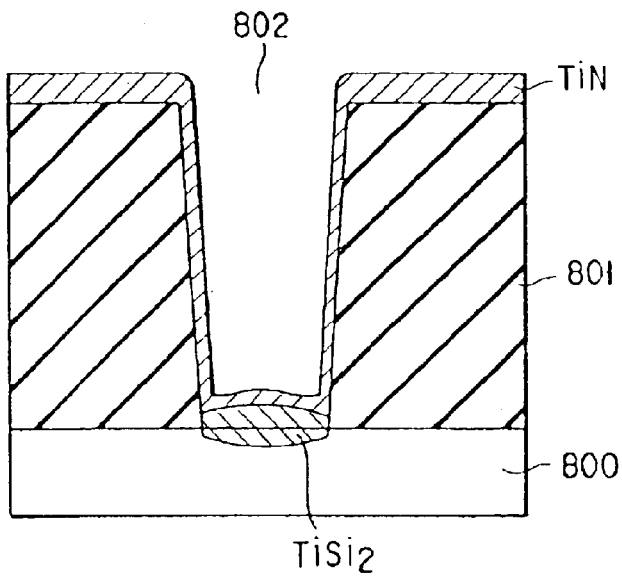
Figure 18C:
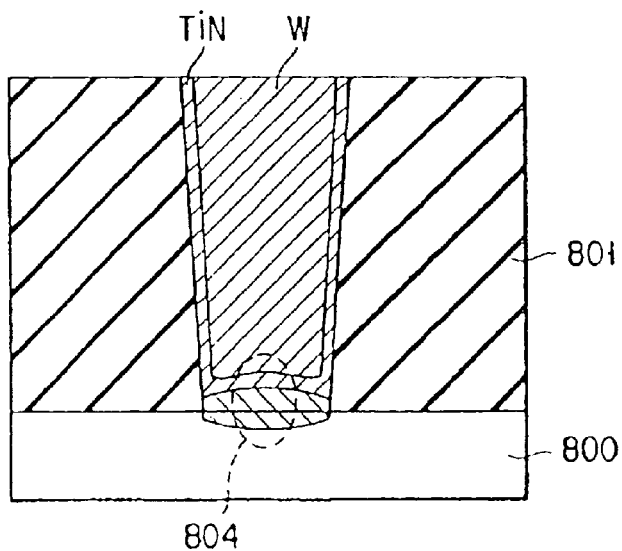
Figure 19A:
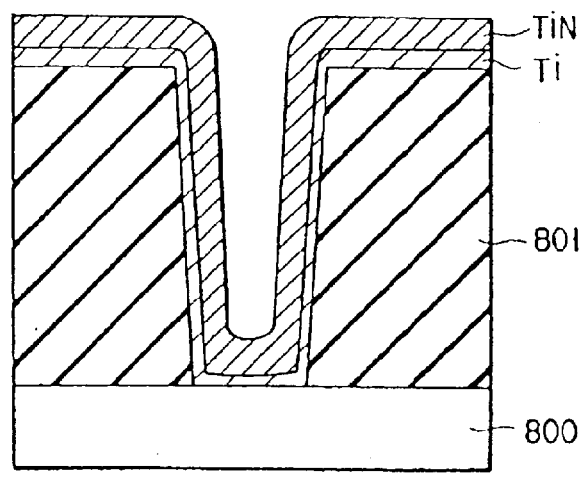
FIGS. 19A to 19C are sectional views showing the steps of a method for manufacturing a contact plug on a Si substrate in order to explain a fourth conventional example.
Figure 19B:
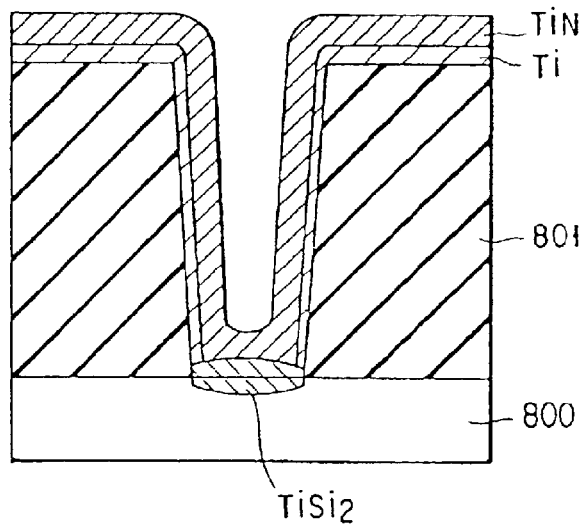
Figure 19C:
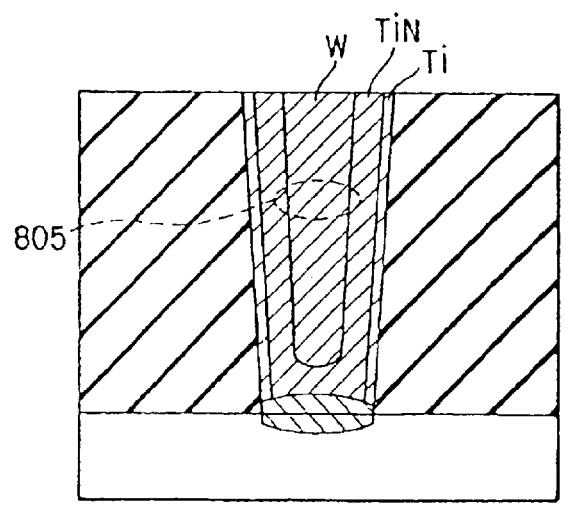

Thereafter, as shown in FIG. 11G, a conductive material 609, e.g., W (tungsten), is embedded in the contact holes 604a, 604b and wiring grooves 603a, 603b. Then, W and the barrier metal materials (608, 605) above the insulation film 623 are removed by, for example, a CMP method, thereby forming a contact hole 610 and a damascene wiring layer 611 at the same time.

Though TiN is used as the barrier metal in the tenth embodiment, the present invention may be applied to a barrier metal other than TiN. The tenth embodiment has the same effects and advantages that are explained in the first embodiment and in the ninth embodiment.

To mention in more detail, a contact hole in which only a side wall free from an alignment error problem is provided with a substantial taper angle in a manner self-aligned with a wiring groove. Hence, a wiring structure which avoids a danger of development of short circuits even if an interval between wirings is reduced and which has good characteristics of embedding a conductive material can be obtained. A highly reliable contact plug structure can be obtained which satisfies the contact resistance, barrier qualities and metal-embedding characteristics even if an outstanding progress in micronization is made.

If the contact plug structure as illustrated in the embodiment seventh, eighth or ninth is applied to each of the first to sixth embodiments, a contact hole is formed in a manner self-aligned with a wiring groove and a wiring structure which avoids a danger of development of short circuits even if an interval between wirings is reduced and which has good characteristics of embedding a conductive material can be obtained. A highly reliable contact plug structure can be obtained which satisfies the contact resistance, barrier qualities and metal-embedding characteristics even if an outstanding progress in micronization is made.

As explained above, in the present invention, firstly it is possible to provide only a prescribed side wall of a contact hole with a taper angle within the extent that it is not inconsistent with the self-alignment of a wiring groove with a contact hole.

Specifically, the side wall of a contact hole only in the direction free from an alignment error problem is provided substantially with a taper angle. Hence the characteristics of embedding a conductive material is improved thereby providing a semiconductor device which contributes to high micronization and an improvement in the reliability and also providing its production method.

Secondarily, because a barrier metal material is formed by an anisotropic deposition method in a contact plug structure, the barrier metal material is scarcely deposited on the side wall of the contact hole. The bottom edge of the contact hole is well-coated. The contact resistance and the barrier qualities can be controlled independently. This enables it possible to satisfy all of the contact resistance, barrier qualities and metal-embedding characteristics simultaneously even if a remarkable progress in micronization is made. Therefore, a method for the production of a semiconductor device having high reliability and yield can be provided.

The above technique of the production of a contact plug is used to form a contact hole in which only the side wall in the direction free from an alignment error problem is provided with a substantial taper angle. A semiconductor device which contributes to high micronization and an improvement in the reliability and in which a contact plug itself has high reliability is thereby provided and its production method can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising the steps of:
   depositing a first insulation film on a semiconductor substrate;
   depositing a second insulation film on the first insulation film;
   forming in the second insulation film an opening portion;
   depositing a third insulation film on the second insulation film and on portions of the first insulation film exposed by the opening portion; and
   etching the third insulation film and the first insulation film to form a wire groove on the third insulation film while the second insulation film is hardly etched, and to form a contact hole in the first insulation film with a substantial taper angle at a portion of a side wall of the contact hole while an edge portion of the opening portion exposed during the etching process is gradually removed, using an anisotropic selective etching technique having a slightly lower etching selectivity.

2. A method of manufacturing a semiconductor device, comprising the steps of:
   forming a transistor provided with a gate electrode on a semiconductor substrate, and a source/region region in the semiconductor substrate, adjacent to the gate electrode;
   depositing a first insulation film over the transistor;
   depositing a second insulation film on the first insulation film;
   forming an opening portion in the second insulation film;
   depositing a third interlayer insulation film on the second interlayer insulation film and a portion of the first insulation film exposed by the opening hole; and
   etching the third insulation film and the first insulation film to form a wire groove on the third insulation film while the second insulation film is hardly etched, and to form in the first insulation film a contact hole leading to the gate electrode or the source/drain region of the transistor with a substantial taper angle at a portion of a side wall of the contact hole while an edge portion of the opening portion exposed during the etching process is gradually removed, using an anisotropic selective etching technique having a slightly lower etching selectivity.

3. A method of manufacturing a semiconductor device comprising the steps of:
   forming an opening hole in an insulation film;
   depositing a first refractory metal film in the opening hole;
   nitrifying a surface of the first refractory metal film;
   depositing a second refractory metal film on a nitrified surface of the first refractory metal film; and
   changing the second refractory metal film to a nitride film by a thermal treatment.

4. The method of manufacturing a semiconductor device according to claim 3, wherein the step of nitrifying the first refractory metal film is performed by heat treatment.

5. The method of manufacturing a semiconductor device according to claim 3, wherein the step of nitrifying a surface of the first refractory metal film is performed by plasma treatment.

6. A method of manufacturing a semiconductor device comprising the steps of:
   forming an opening hole in an insulating film;
   depositing a first refractory metal film in the opening hole;
   depositing a refractory metal nitride film on a surface of the first refractory metal film;
   depositing a second refractory metal film on a surface of the refractory metal nitride film; and
   changing the second refractory metal film to a nitride film by heat treatment.

7. The method of manufacturing a semiconductor device according to claim 3, wherein the step of depositing the first refractory metal film in the contact hole and the step of depositing the second refractory metal film in the contact hole are performed by a film forming technique having a stronger anisotropy by which only a slight deposition occurs on a side wall of the contact hole than on a bottom surface of the contact hole.

8. The method of manufacturing a semiconductor device according to claim 6, wherein the step of depositing the first refractory metal film in the contact hole and the step of depositing the second refractory metal film in the contact hole are performed by a film forming technique having a stronger anisotropy by which only a slight deposition occurs on side wall of the contact hole than on a bottom surface of the contact hole.

9. The method of manufacturing a semiconductor device according to claim 7, wherein the film forming technique having a stronger anisotropy is an Ion-Metal-Plasma process.

10. The method of manufacturing a semiconductor device according to claim 8, wherein the film forming technique having a stronger anisotropy is an Ion-Metal-Plasma process.

* * * * *